(12) United States Patent
Hampden-Smith et al.

(10) Patent No.: US 7,226,547 B2
(45) Date of Patent: *Jun. 5, 2007

(54) ELECTROLUMINESCENT PHOSPHOR POWDERS, METHODS FOR MAKING PHOSPHOR POWDERS AND DEVICES INCORPORATING SAME

(75) Inventors: Mark J. Hampden-Smith, Albuquerque, NM (US); Toivo T. Kodas, Albuquerque, NM (US); James Caruso, Albuquerque, NM (US); Quint H. Powell, Albuquerque, NM (US); Klaus Kunze, Albuquerque, NM (US); Daniel J. Skamser, Greenville, SC (US)

(73) Assignee: Cabot Corporation, Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/410,700

(22) Filed: Apr. 24, 2006

(65) Prior Publication Data

US 2006/0257659 A1    Nov. 16, 2006

Related U.S. Application Data

(60) Continuation of application No. 10/672,792, filed on Sep. 26, 2003, now Pat. No. 7,067,070, which is a continuation of application No. 09/757,302, filed on Jan. 9, 2001, now Pat. No. 6,627,115, which is a division of application No. 09/140,525, filed on Aug. 27, 1998, now Pat. No. 6,193,908, which is a continuation-in-part of application No. 09/028,603, filed on Feb. 24, 1998, now Pat. No. 6,180,029, and a continuation-in-part of application No. 09/030,060, filed on Feb. 24, 1998, now Pat. No. 6,153,123, and a continuation-in-part of application No. 09/030,057, filed on Feb. 24, 1998, now Pat. No. 6,338,809.

(60) Provisional application No. 60/039,450, filed on Feb. 24, 1997, provisional application No. 60/038,262, filed on Feb. 24, 1997.

(51) Int. Cl.
*C09K 11/08* (2006.01)

(52) U.S. Cl. .................. 252/301.36; 252/301.4 R; 252/301.4 P; 252/301.4 F; 252/301.4 S; 252/301.5; 252/301.6 R; 252/301.6 P; 252/301.6 F; 252/301.6 S

(58) Field of Classification Search ............. 428/403, 428/404, 407; 252/301.36, 301.4 R–301.4 H, 252/301.5, 301.6 R–301.6 F
See application file for complete search history.

(56) References Cited

U.S. PATENT DOCUMENTS

| | | | | |
|---|---|---|---|---|
| 3,878,119 A | * | 4/1975 | Nath | 252/301.4 S |
| 4,377,769 A | * | 3/1983 | Beatty et al. | 313/495 |
| 4,508,760 A | * | 4/1985 | Olson et al. | 427/213.34 |
| 4,826,727 A | * | 5/1989 | Glaser | 428/403 |

(Continued)

FOREIGN PATENT DOCUMENTS

WO     WO 96/09353    *    3/1996

*Primary Examiner*—C. Melissa Koslow
(74) *Attorney, Agent, or Firm*—Marsh Fischmann & Breyfogle LLP

(57) ABSTRACT

Electroluminescent phosphor powders and a method for making phosphor powders. The phosphor powders have a small particle size, narrow particle size distribution and are substantially spherical. The method of the invention advantageously permits the economic production of such powders. The invention also relates to improved devices, such as electroluminescent display devices, incorporating the phosphor powders.

12 Claims, 32 Drawing Sheets

U.S. PATENT DOCUMENTS

| | | | |
|---|---|---|---|
| 5,166,456 A * | 11/1992 | Yoshino | 252/301.4 S |
| 5,269,966 A * | 12/1993 | Karam et al. | 252/301.6 S |
| 5,739,632 A * | 4/1998 | Haase et al. | 313/467 |
| 6,077,458 A * | 6/2000 | Shiiki et al. | 252/301.4 R |
| 6,153,123 A * | 11/2000 | Hampden-Smith et al. | 252/301.4 S |
| 6,180,029 B1 * | 1/2001 | Hampden-Smith et al. | 252/301.4 R |
| 6,193,908 B1 * | 2/2001 | Hampden-Smith et al. | 252/301.4 R |
| 6,602,439 B1 * | 8/2003 | Hampden-Smith et al. | 252/79.1 |
| 6,645,398 B1 * | 11/2003 | Hampden-Smith et al. | 252/301.4 S |

* cited by examiner

AEROSOL GENERATOR 106 → 108 → FURNACE 110 → 112 → PARTICLE COOLER 320 → 322 → PARTICLE COLLECTOR 114 → 116

ELECTROLUMINESCENT PHOSPHOR POWDERS, METHODS FOR MAKING PHOSPHOR POWDERS AND DEVICES INCORPORATING SAME

CROSS-REFERENCE TO RELATED APPLICATIONS

This application is a continuation application of U.S. patent application Ser. No. 10/672,792, now U.S. Pat. No. 7,067,070, filed on Sep. 26, 2003, which is a continuation of U.S. patent application Ser. No. 09/757,302 filed on Jan. 9, 2001, now U.S. Pat. No. 6,627,115, which is a divisional application of U.S. patent application Ser. No. 09/140,525, filed on Aug. 27, 1998, now U.S. Patent No. 6,193,908, which is a continuation-in-part application of U.S. patent application Ser. No. 09/028,603, now U.S. Pat. No. 6,180,029, U.S. patent application Ser. No. 09/030,060, now U.S. Pat. No. 6,153,123 and U.S. patent application Ser. No. 09/030,057, now U.S. Pat. No. 6,338,809, each filed Feb. 24, 1998 and claiming priority to U.S. Provisional Application Nos. 60/038,262 and 60/039,450, both filed on Feb. 24, 1997. The contents of each of the foregoing are incorporated herein by reference in their entirety.

STATEMENT REGARDING FEDERALLY-SPONSORED RESEARCH/DEVELOPMENT

This invention was made with Government support under contracts N00014-95-C-0278 and N00014-96-C-0395 awarded by the Office of Naval Research. The Government has certain rights in the invention.

BACKGROUND OF THE INVENTION

1. Field of the Invention

The present invention relates to electroluminescent phosphor powders, methods for producing electroluminescent phosphor powders and devices such as electroluminescent lamps and displays incorporating the powders. In particular, the present invention is directed to electroluminescent phosphor powders having well controlled chemical and physical properties. The present invention also relates to a method for producing such powders by spray-conversion.

2. Description of Related Art

Phosphors are compounds that are capable of emitting useful quantities of radiation in the visible and/or ultraviolet spectrums upon excitation of the material by an external energy source. Due to this property, phosphor compounds have long been utilized in cathode ray tube (CRT) screens for televisions and similar devices. Typically, inorganic phosphor compounds include a host material doped with a small amount of an activator ion.

More recently, phosphor compounds, including phosphors in particulate form, have been utilized in many advanced display devices that provide illuminated text, graphics or video output. In particular, there has been significant growth in the field of flat panel display devices such as thick film and thin film electroluminescent displays.

Liquid crystal displays (LCD) use a low power electric field to modify a light path and are commonly used in wristwatches, pocket televisions, gas pumps, pagers and similar devices. Active matrix liquid crystal displays (AM-LCD) are commonly used for laptop computers. Thin film and thick film electroluminescent displays (TFEL) utilize a film of phosphorescent material trapped between glass plates and electrodes to emit light in an electric field. Phosphor powders are also utilized in electroluminescent lamps (EL), which include phosphor powder deposited on a polymer substrate which emits light when an electric field is applied.

There are a number of requirements for phosphor powders, which can vary dependent upon the specific application of the powder. Generally, phosphor powders should have one or more of the following properties: high purity; high crystallinity; small particle size; narrow particle size distribution; spherical morphology; controlled surface chemistry; homogenous distribution of the activator ion; good dispersibility; and low porosity. The proper combination of the foregoing properties will result in a phosphor powder with high luminescent intensity and long lifetime that can be used in many applications. It is also advantageous for many applications to provide phosphor powders that are surface passivated or coated, such as with a thin, uniform dielectric or semiconducting coating.

There are a number of requirements for phosphor powders, which can vary dependent upon the specific application of the powder. Generally, phosphor powders should have one or more of the following properties: high purity; high crystallinity; small particle size; narrow particle size distribution; spherical morphology; controlled surface chemistry; homogenous distribution of the activator ion; good dispersibility; and low porosity. The proper combination of the foregoing properties will result in a phosphor powder with high luminescent intensity and long lifetime. It is also advantageous for many applications to provide phosphor powders that are surface passivated or coated, such as with a thin, uniform dielectric or semiconducting coating.

Numerous methods have been proposed for producing phosphor particles. One such method is referred to as the solid-state method. In this process, the phosphor precursor materials are mixed in the solid state and are heated so that the precursors react and form a powder of the phosphor material. For example, U.S. Pat. No. 4,925,703 by Kasenga et al. discloses a method for the production of a manganese activated zinc silicate phosphor ($ZnSiO_4$:Mn). The method includes a step of dry blending a mixture of starting components such as zinc oxide, silicic acid and manganese carbonate and firing the blended mixture at about 1250° C. The resulting phosphor is broken up or crushed into smaller particles. Solid-state routes, and many other production methods, utilize such a grinding step to reduce the particle size of the powders. The mechanical grinding damages the surface of the phosphor, forming dead layers which inhibit the brightness of the phosphor powders.

Phosphor powders have also been made by liquid precipitation. In these methods, a solution which includes phosphor particle precursors is chemically treated to precipitate phosphor particles or phosphor particle precursors. These particles are typically calcined at an elevated temperature to produce the phosphor compound. The particles must often be further crushed, as is the case with solid-state methods.

In yet another method, phosphor particle precursors or phosphor particles are dispersed in a solution which is then spray dried to evaporate the liquid. The phosphor particles are thereafter sintered in the solid state at an elevated temperature to crystallize the powder and form a phosphor. For example, U.S. Pat. No. 4,948,527 by Ritsko et al. discloses a process for producing $Y_2O_3$:Eu phosphors by dispersing yttrium oxide in a europium citrate solution to form a slurry which is then spray dried. The spray dried powder was then converted to an oxide by firing at about 1000° C. for two hours and then at 1600° C. for about four hours. The fired powder was then lightly crushed and cleaned to recover useful phosphor particles.

U.S. Pat. No. 5,644,193 by Matsuda et al. discloses phosphor powders having an average particle size of up to 20 μm. The phosphors can include rare earth oxides, rare earth oxysulfides and tungstates. The particles are produced by fusing phosphor particles in a thermal plasma and rapidly cooling the particles.

Despite the foregoing, there remains a need for electroluminescent phosphor powders with high luminescent intensity that include particles having a substantially spherical morphology, narrow particle size distribution, a high degree of crystallinity and good homogeneity. The powder should have good dispersibility and the ability to be fabricated into thin layers having uniform thickness. Phosphor powders having these properties will be particularly useful in electroluminescent display devices.

SUMMARY OF THE INVENTION

The present invention provides improved phosphor powder batches including phosphors having a small particle size, narrow particle size distribution, spherical morphology and good crystallinity. The present invention also provides methods for forming phosphor powder batches and devices such as electroluminescent lamps incorporating the powder batches.

BRIEF DESCRIPTION OF THE DRAWINGS

FIG. 28 is a process block diagram of one embodiment of the present invention including a particle cooler.

Figure 34:
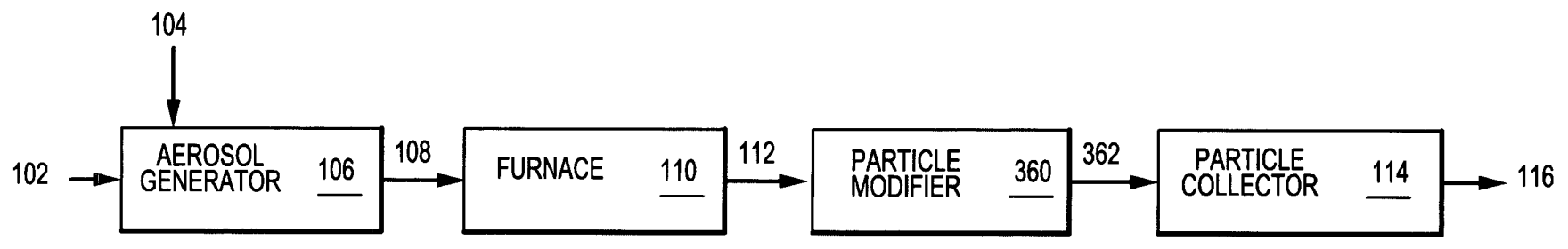

FIG. 34 is a block diagram of one embodiment of the present invention including a particle modifier.

DESCRIPTION OF THE INVENTION

Figure 1:
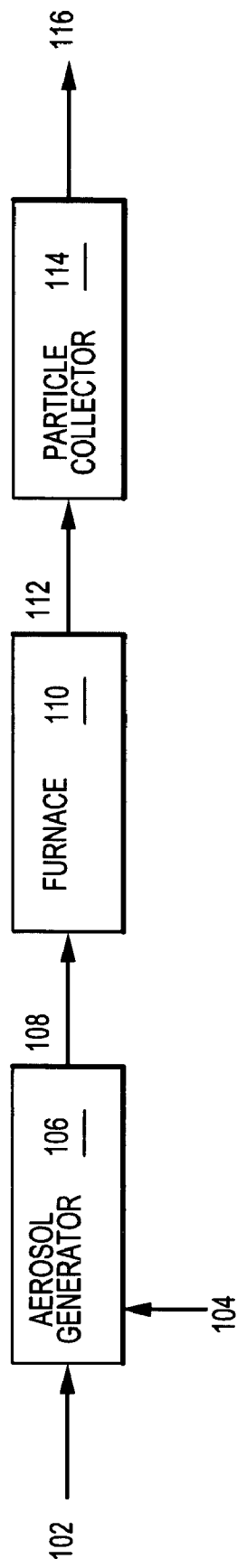
FIG. 1 is a process block diagram showing one embodiment of the process of the present invention.

The present invention is generally directed to electroluminescent phosphor powders and methods for producing the powders, as well as devices which incorporate the powders. Electroluminescent phosphors emit light, typically visible light, upon stimulation by an electric field. These phosphors are utilized in electroluminescent lamps and display devices.

In one aspect, the present invention provides a method for preparing a particulate product. A feed of liquid-containing, flowable medium, including at least one precursor for the desired particulate product, is converted to aerosol form, with droplets of the medium being dispersed in and suspended by a carrier gas. Liquid from the droplets in the aerosol is then removed to permit formation in a dispersed state of the desired particles. In one embodiment, the particles are subjected, while still in a dispersed state, to compositional or structural modification, if desired. Compositional modification may include, for example, coating the particles. Structural modification may include, for example, crystallization, recrystallization or morphological alteration of the particles. The term powder is often used herein to refer to the particulate product of the present invention. The use of the term powder does not indicate, however, that the particulate product must be dry or in any particular environment. Although the particulate product is typically manufactured in a dry state, the particulate product may, after manufacture, be placed in a wet environment, such as in a paste or slurry.

The process of the present invention is particularly well suited for the production of particulate products of finely divided particles having a small weight average size. In addition to making particles within a desired range of weight average particle size, with the present invention the particles may be produced with a desirably narrow size distribution, thereby providing size uniformity that is desired for many applications.

In addition to control over particle size and size distribution, the method of the present invention provides significant flexibility for producing phosphor particles of varying composition, crystallinity and morphology. For example, the present invention may be used to produce homogeneous particles involving only a single phase or multi-phase particles including multiple phases. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Referring now to FIG. 1, one embodiment of the process of the present invention is described. A liquid feed 102, including at least one precursor for the desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce a particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 μm in size, preferably smaller than about 0.5 μm in size, and more preferably smaller than about 0.3 μm in size and most preferably smaller than about 0.1 μcm in size. Most preferably, the suspended particles should be colloidal. The suspended particles could be finely divided particles, or could be agglomerate masses comprised of agglomerated smaller primary particles. For example, 0.5 μm particles could be agglomerates of nanometer-sized primary particles. When the liquid feed 102 includes suspended particles, the particles typically comprise no greater than about 10 weight percent of the liquid feed.

As noted, the liquid feed 102 includes at least one precursor for preparation of the particles 112. The precursor may be a substance in either a liquid or solid phase of the liquid feed 102. Frequently, the precursor will be a material, such as a salt, dissolved in a liquid solvent of the liquid feed 102. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise at least one component originally contributed by the precursor.

The liquid feed 102 may include multiple precursor materials, which may be present together in a single phase or separately in multiple phases. For example, the liquid feed 102 may include multiple precursors in solution in a single liquid vehicle. Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. Different components contributed by different precursors may be present in the particles together in a single material phase, or the different components may be present in different material phases when the particles 112 are composites of multiple phases. Specific examples of preferred precursors for the electroluminescent phosphor particles of the present invention are discussed more fully below.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s) that contribute to formation of the particles 112. In that regard, the carrier gas may include one or more reactive components that react in the furnace 110 to contribute to formation of the particles 112. Preferred carrier gas compositions for electroluminescent phosphor particles of the present invention are discussed more fully below.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the particles 112 may be produced at a desired small size with a narrow size distribution, which are advantageous for many applications.

The aerosol generator 106 is capable of producing the aerosol 108 such that it includes droplets having a weight average size in a range having a lower limit of about 1 μm and preferably about 2 μm; and an upper limit of about 10 μm; preferably about 7 μm, more preferably about 5 μm and most preferably about 4 μm. A weight average droplet size in a range of from about 2 μm to about 4 μm is more preferred for most applications, with a weight average droplet size of about 3 μm being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 μm and more preferably at least about 70 weight percent (more preferably at least about 80 weight percent and most preferably at least about 85 weight percent) are smaller than about 5 μm. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. In that regard, the aerosol 108 preferably includes greater than about $1 \times 10^6$ droplets per cubic centimeter of the aerosol 108, more preferably greater than about $5 \times 10^6$ droplets per cubic centimeter, still more preferably greater than about $1 \times 10^7$ droplets per cubic centimeter, and most preferably greater than about $5 \times 10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 μm to about 4 μm, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. The maximum average stream temperature, or conversion temperature, refers to the maximum average temperature that an aerosol stream attains while flowing through the furnace. This is typically determined by a temperature probe inserted into the furnace. Preferred conversion temperatures according to the present invention are discussed more fully below.

Although longer residence times are possible, for many applications, residence time in the heating zone of the furnace 110 of shorter than about 4 seconds is typical, with shorter than about 2 seconds being preferred, such as from about 1 to 2 seconds. The residence time should be long enough, however, to assure that the particles 112 attain the desired maximum stream temperature for a given heat transfer rate. In that regard, with extremely short residence times, higher furnace temperatures could be used to increase the rate of heat transfer so long as the particles 112 attain a maximum temperature within the desired stream temperature range. That mode of operation, however, is not preferred. Also, it is preferred that, in most cases, the maximum stream temperature not be attained in the furnace 110 until substantially at the end of the heating zone in the furnace 110. For example, the heating zone will often include a plurality of heating sections that are each independently controllable. The maximum stream temperature should typically not be attained until the final heating section, and more preferably until substantially at the end of the last heating section. This is important to reduce the potential for thermophoretic losses of material. Also, it is noted that as used herein, residence time refers to the actual time for a material to pass through the relevant process equipment. In the case of the furnace, this includes the effect of increasing velocity with gas expansion due to heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica (quartz) or alumina. Alternatively, the tube may be metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems. One type of tube that is particularly useful according to the present invention is a lined metallic tube, such as a metal tube whose interior surface is lined with alumina.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for spray-converting particles that do not require a maximum tube wall temperature of higher than about 1100° C. during particle manufacture, which is the case for the electroluminescent phosphor particles according to the present invention.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

Figure 2:
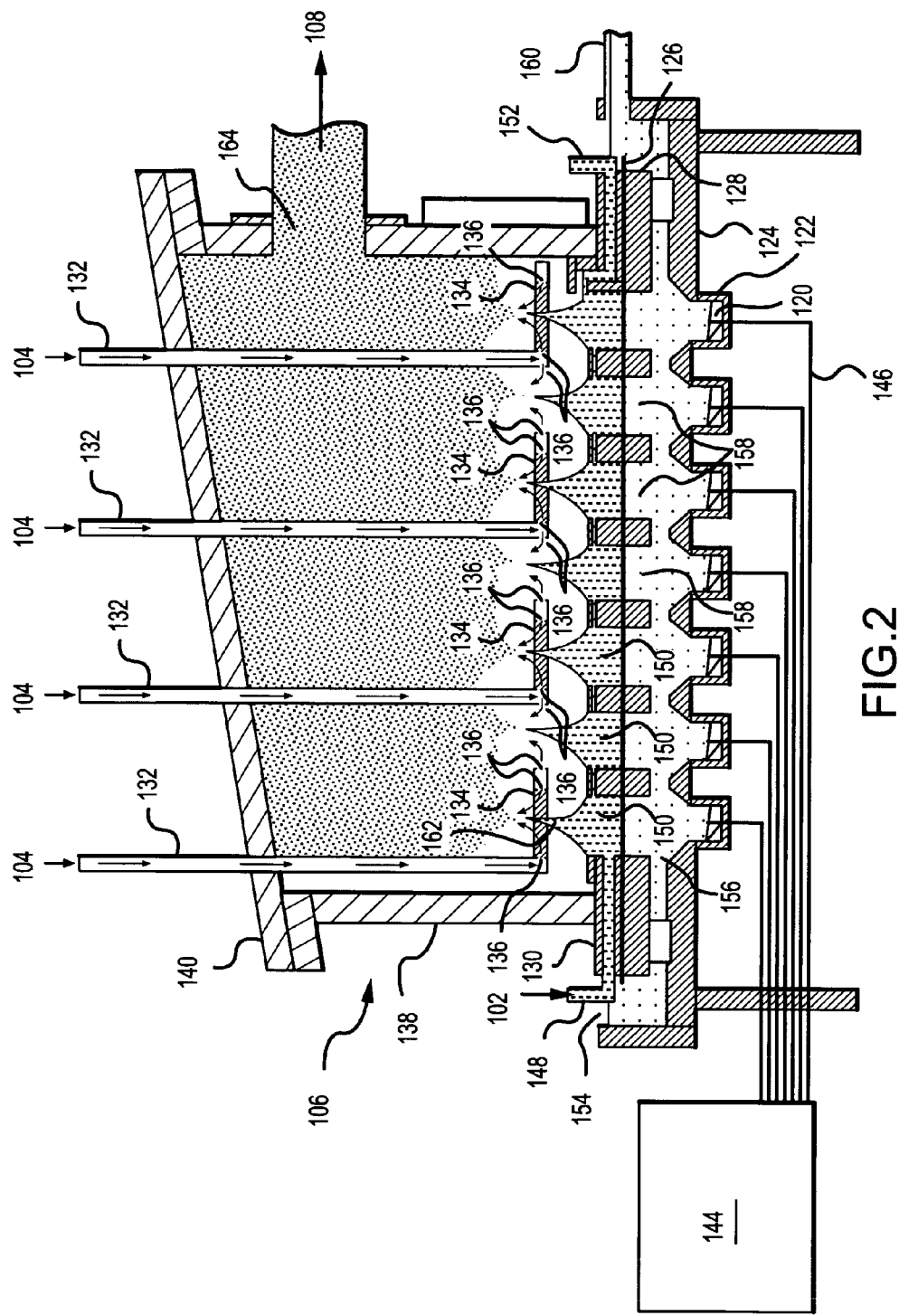
FIG. 2 is a side view in cross section of one embodiment of aerosol generator of the present invention.
Figure 3:
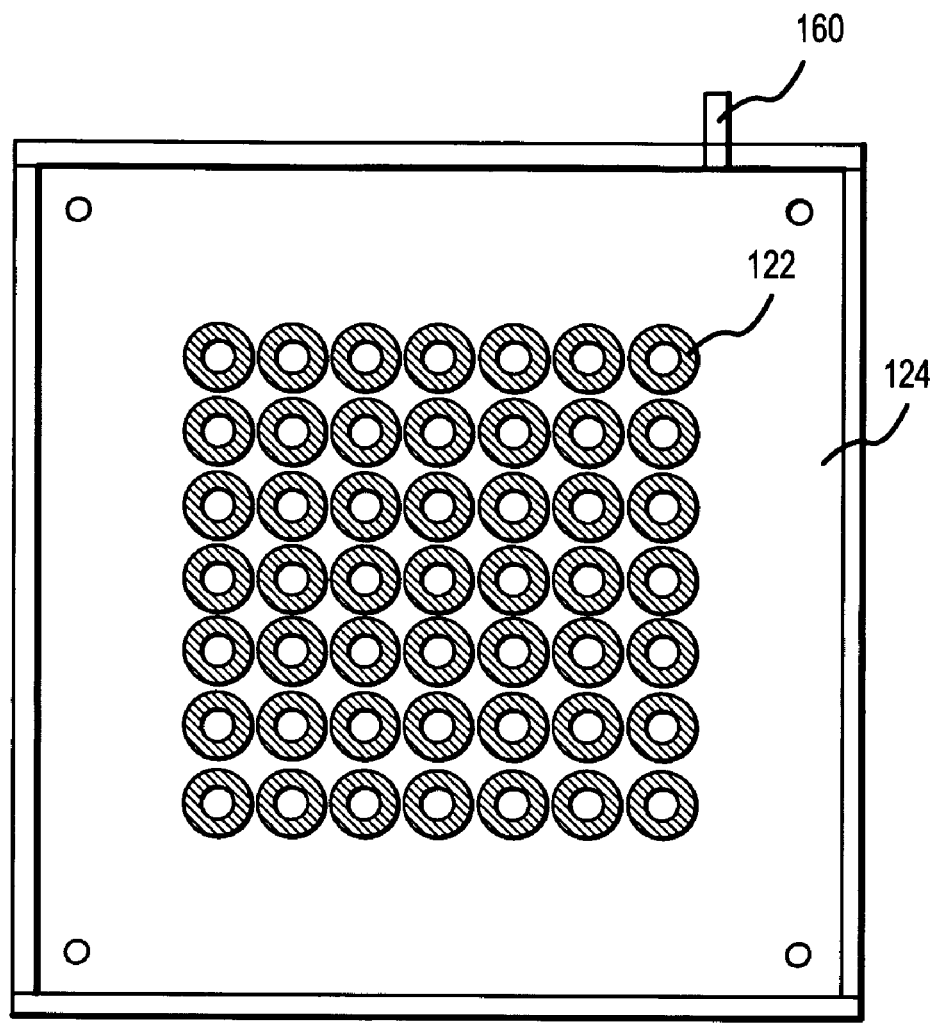
FIG. 3 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 2, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 2, includes forty-nine transducers in a 7×7 array. The array configuration is as shown in FIG. 3, which depicts the locations of the transducer housings 122 mounted to the transducer mounting plate 124.

With continued reference to FIG. 2, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 2, the transducer discs 120 are activated by the transducer driver 144 via the electrical cables 146. The transducers preferably vibrate at a frequency of from about 1 MHz to about 5 MHz, more preferably from about 1.5 MHz to about 3 MHz. Commonly used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 2 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 2, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102 as well as the temperature of the water bath volume 156. It has been found that when the liquid feed 102 and/or the water bath volume includes an aqueous liquid at an elevated temperature, the droplet loading increases significantly. The temperature of the liquid feed 102 and/or the water bath volume 156 is preferably higher than about 30° C., and more preferably higher than about 35° C. If the temperature becomes too high, however, it can have a detrimental effect on droplet loading in the aerosol 108. Therefore, the temperature of the liquid feed 102 and/or the water bath volume should generally be lower than about 50° C., and preferably lower than about 45° C. Either the liquid feed 102 or the water bath volume 156 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 4:
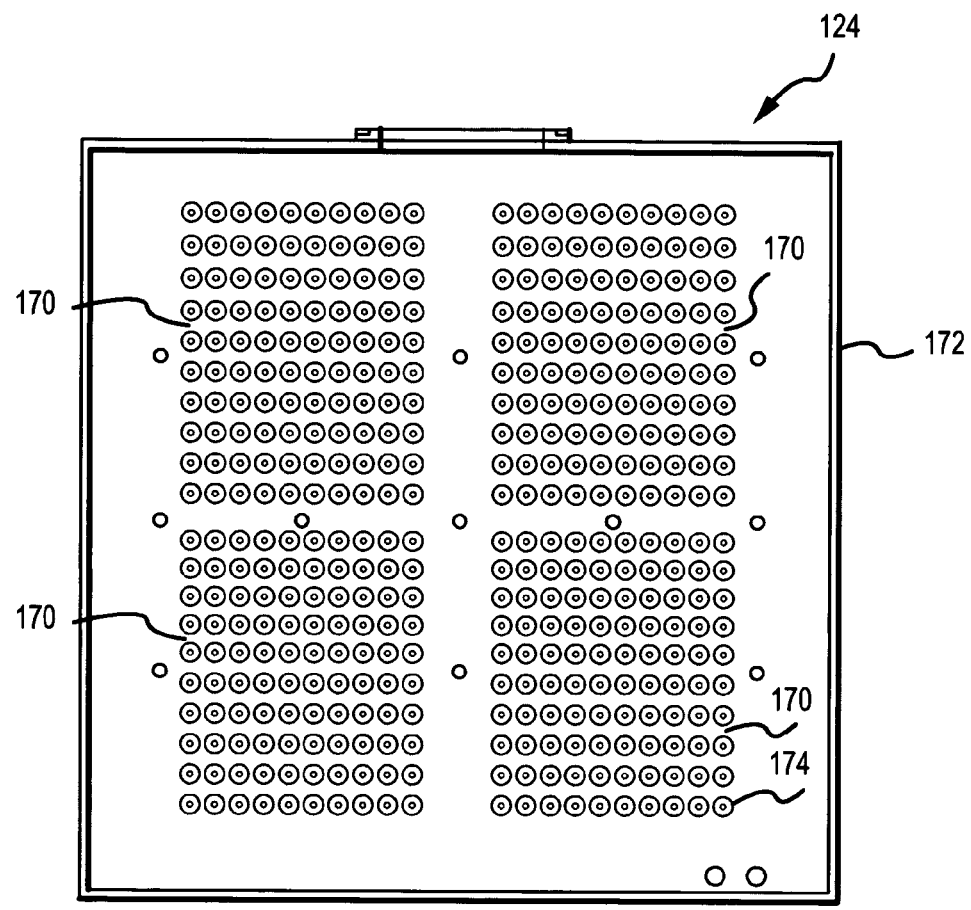
FIG. 4 is a top view of a transducer mounting plate for a 400 transducer array for use in an ultrasonic generator of the present invention.
Figure 5:
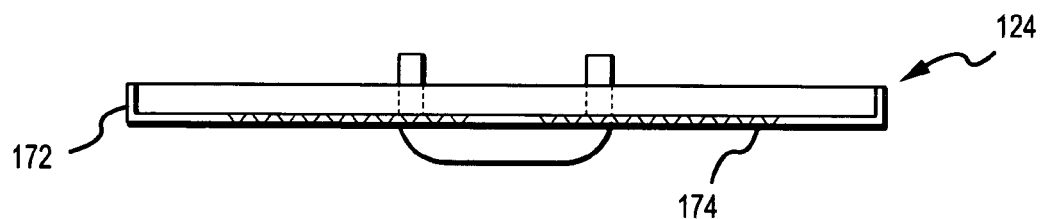
FIG. 5 is a side view of the transducer mounting plate shown in FIG. 4.

FIGS. 4-21 show component designs for an aerosol generator 106 including an array of 400 ultrasonic transducers. Referring first to FIGS. 4 and 5, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 2.

Figure 6:
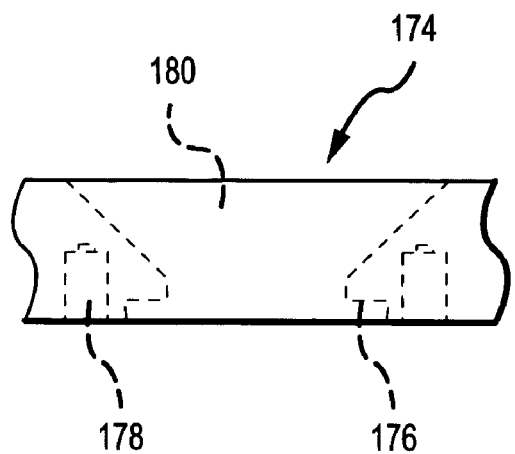
FIG. 6 is a partial side view showing the profile of a single transducer mounting receptacle of the transducer mounting plate shown in FIG. 4.

As shown in FIGS. 4 and 5, four hundred transducer mounting receptacles 174 are provided in the transducer mounting plate 124 for mounting ultrasonic transducers for the desired array. With reference to FIG. 6, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 2.

Figure 7:
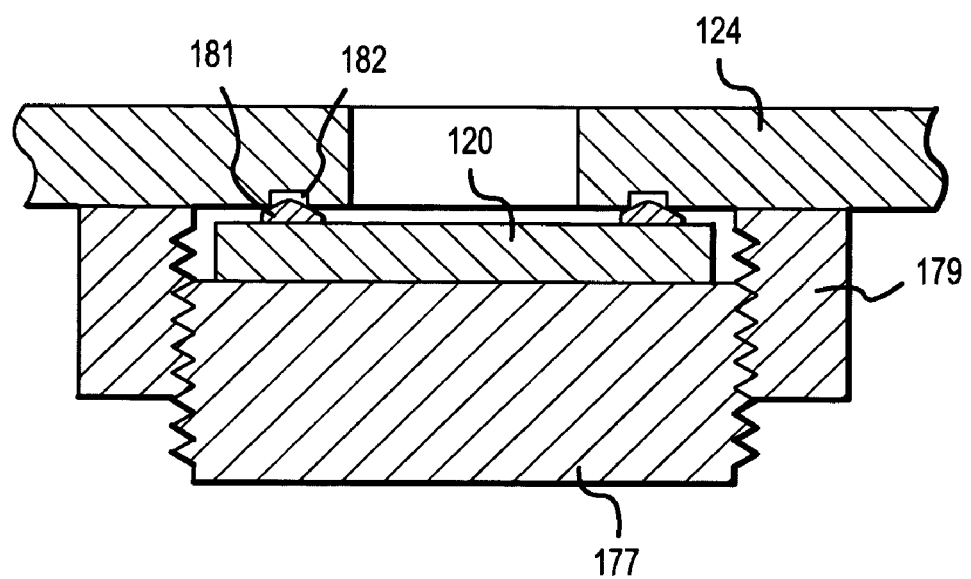
FIG. 7 is a partial side view in cross-section showing an alternative embodiment for mounting an ultrasonic transducer.

A preferred transducer mounting configuration, however, is shown in FIG. 7 for another configuration for the transducer mounting plate 124. As seen in FIG. 7, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Figure 8:
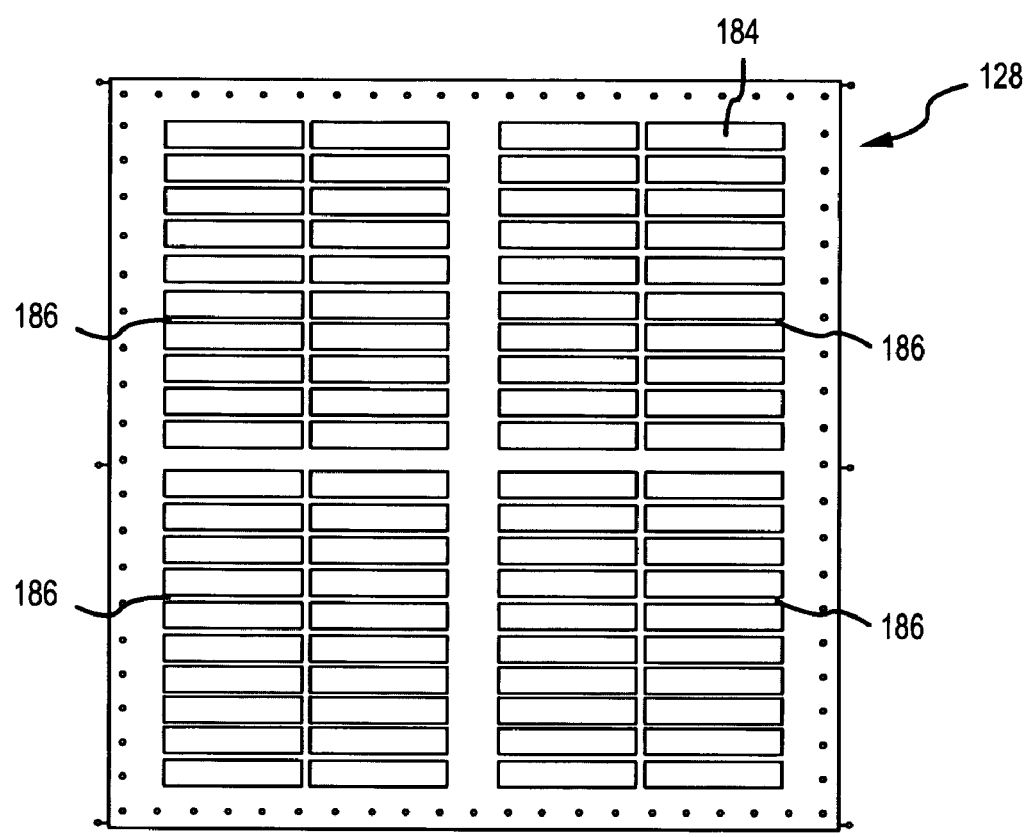
FIG. 8 is a top view of a bottom retaining plate for retaining a separator for use in an aerosol generator of the present invention.

Referring now to FIG. 8, the bottom retaining plate 128 for a 400 transducer array is shown having a design for mating with the transducer mounting plate 124 (shown in FIGS. 4-5). The bottom retaining plate 128 has eighty openings 184, arranged in four subgroups 186 of twenty openings 184 each. Each of the openings 184 corresponds with five of the transducer mounting receptacles 174 (shown in FIGS. 4 and 5) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 9:
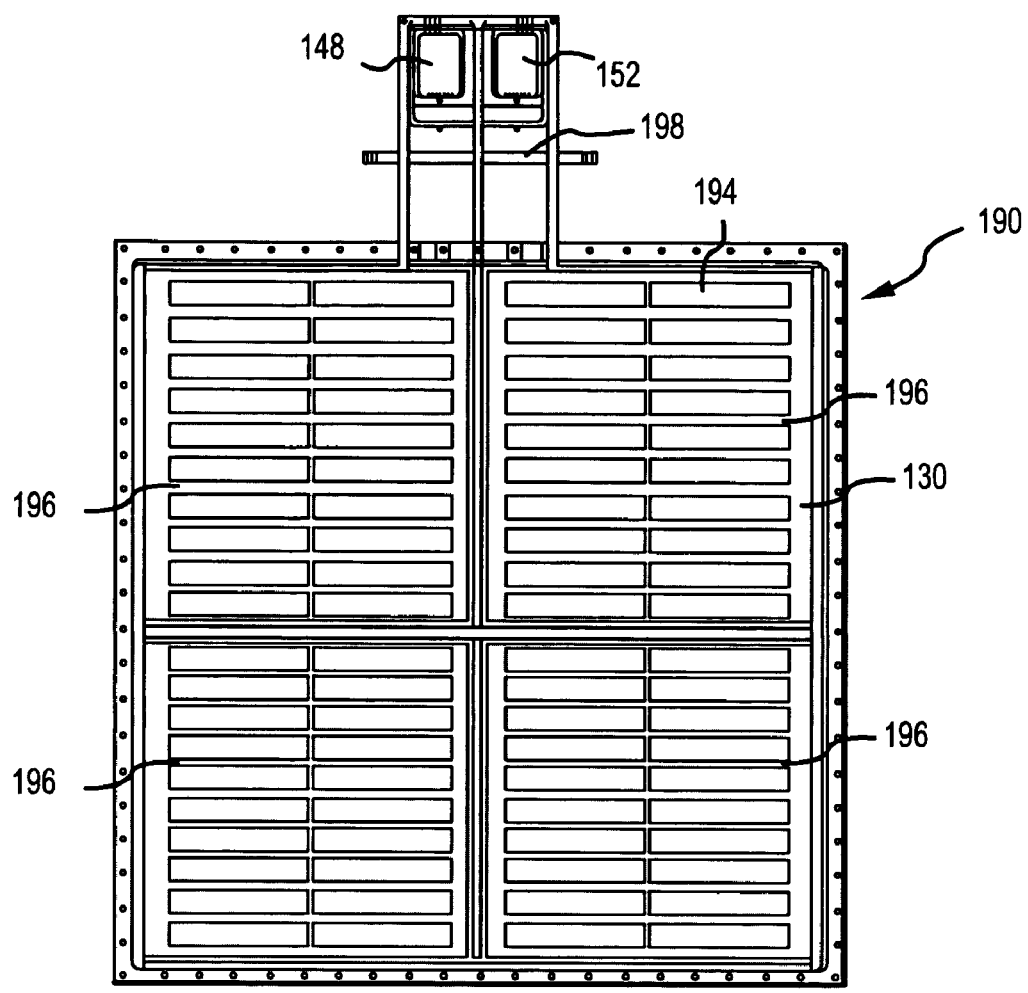
FIG. 9 is a top view of a liquid feed box having a bottom retaining plate to assist in retaining a separator for use in an aerosol generator of the present invention.
Figure 10:
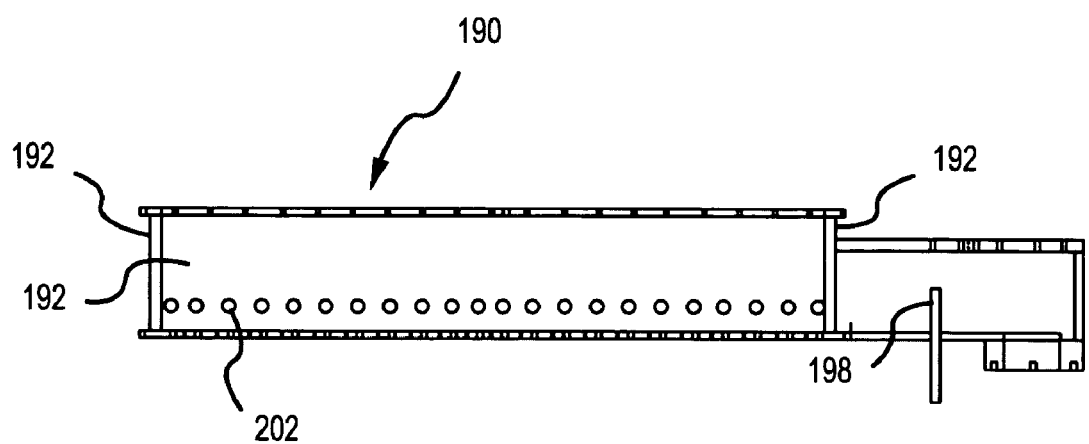
FIG. 10 is a side view of the liquid feed box shown in FIG. 9.

Referring now to FIGS. 9 and 10, a liquid feed box 190 for a 400 transducer array is shown having the top retaining plate 130 designed to fit over the bottom retaining plate 128 (shown in FIG. 8), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 9 and 10 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 8). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 11:
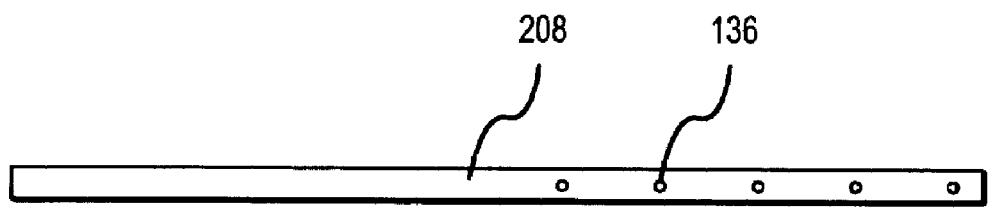
FIG. 11 is a side view of a gas tube for delivering gas within an aerosol generator of the present invention.

Referring now to FIGS. 9-11, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 11. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 12:
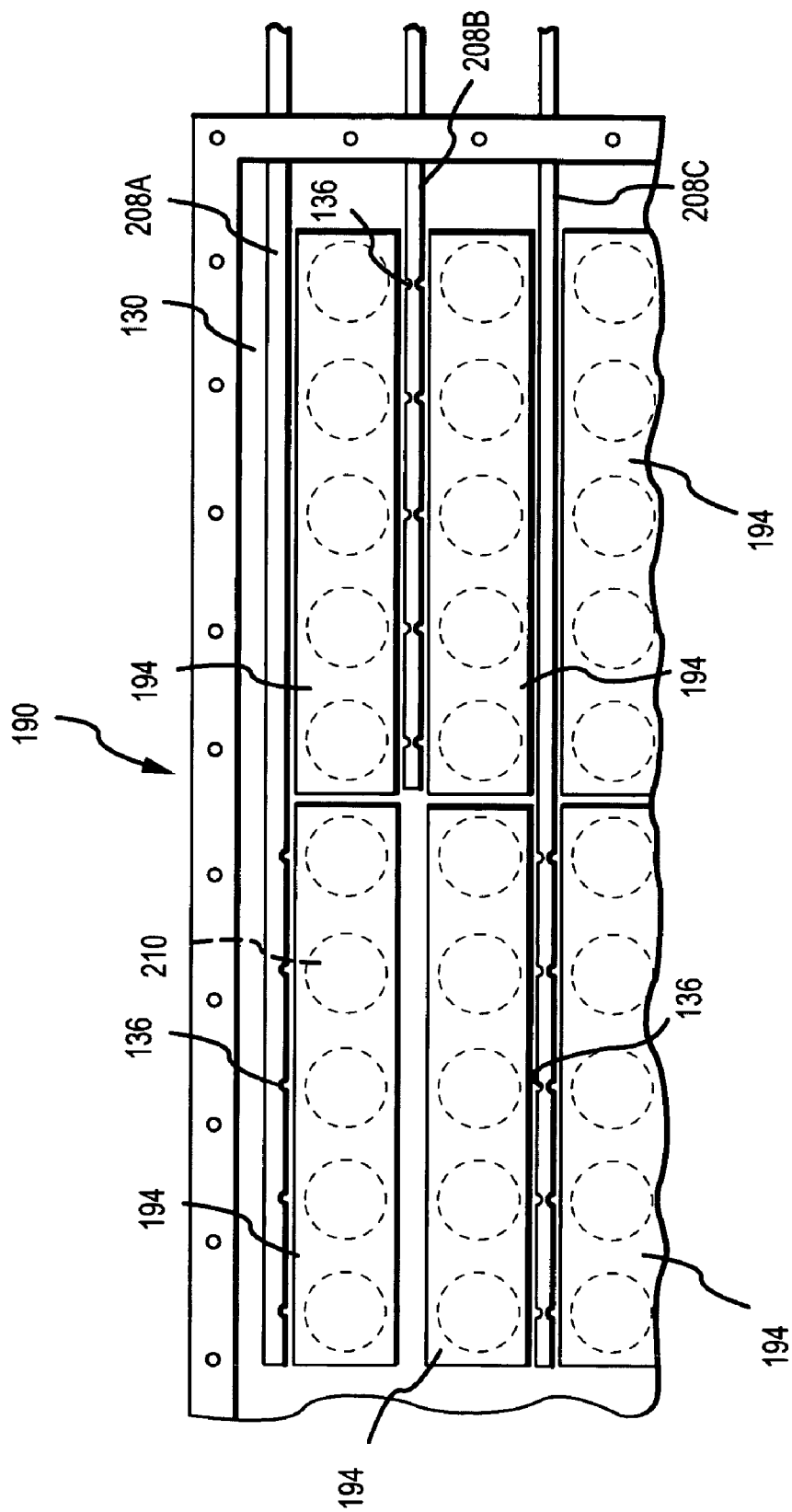
FIG. 12 shows a partial top view of gas tubes positioned in a liquid feed box for distributing gas relative to ultrasonic transducer positions for use in an aerosol generator of the present invention.

Referring now to FIG. 12, a partial view of the liquid feed box 190 is shown with gas tubes 208A, 208B and 208C positioned adjacent to the openings 194 through the top retaining plate 130. Also shown in FIG. 12 are the relative locations that ultrasonic transducer discs 120 would occupy when the aerosol generator 106 is assembled. As seen in FIG. 12, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 12, therefore, includes one gas delivery port per ultrasonic transducer disc 120. Although this is a lower density of gas delivery ports 136 than for the embodiment of the aerosol generator 106 shown in FIG. 2, which includes two gas delivery ports per ultrasonic transducer disc 120, the design shown in FIG. 12 is, nevertheless, capable of producing a dense, high-quality aerosol without unnecessary waste of gas.

Figure 13:
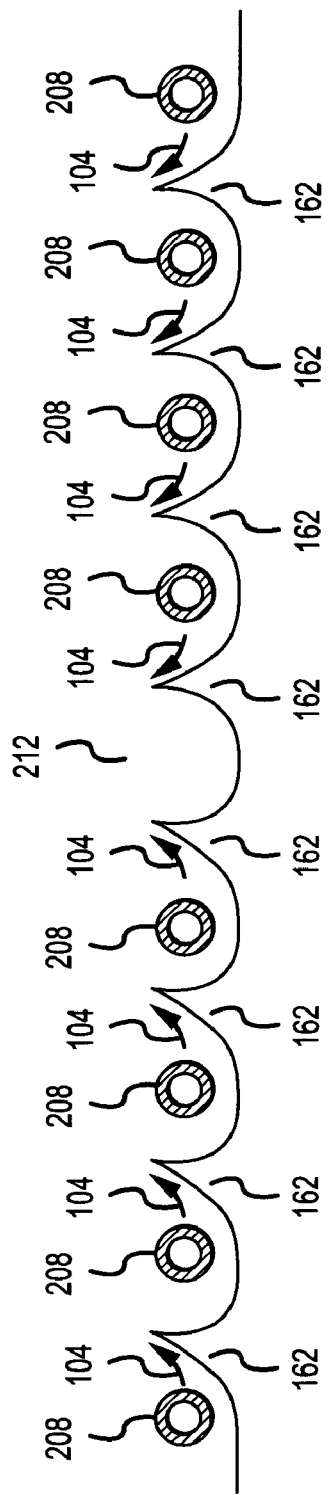
FIG. 13 shows one embodiment for a gas distribution configuration for the aerosol generator of the present invention.

Referring now to FIG. 13, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 11. The carrier gas 104 sweeps both directions from each of the gas tubes 208.

Figure 14:
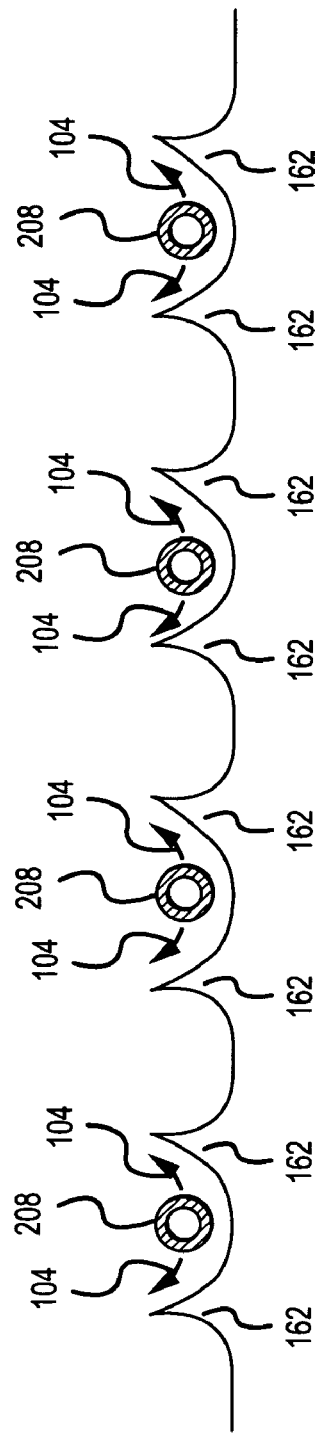
FIG. 14 shows another embodiment for a gas distribution configuration for the aerosol generator of the present invention.

An alternative, and preferred, flow for carrier gas 104 is shown in FIG. 14. As shown in FIG. 14, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 15:
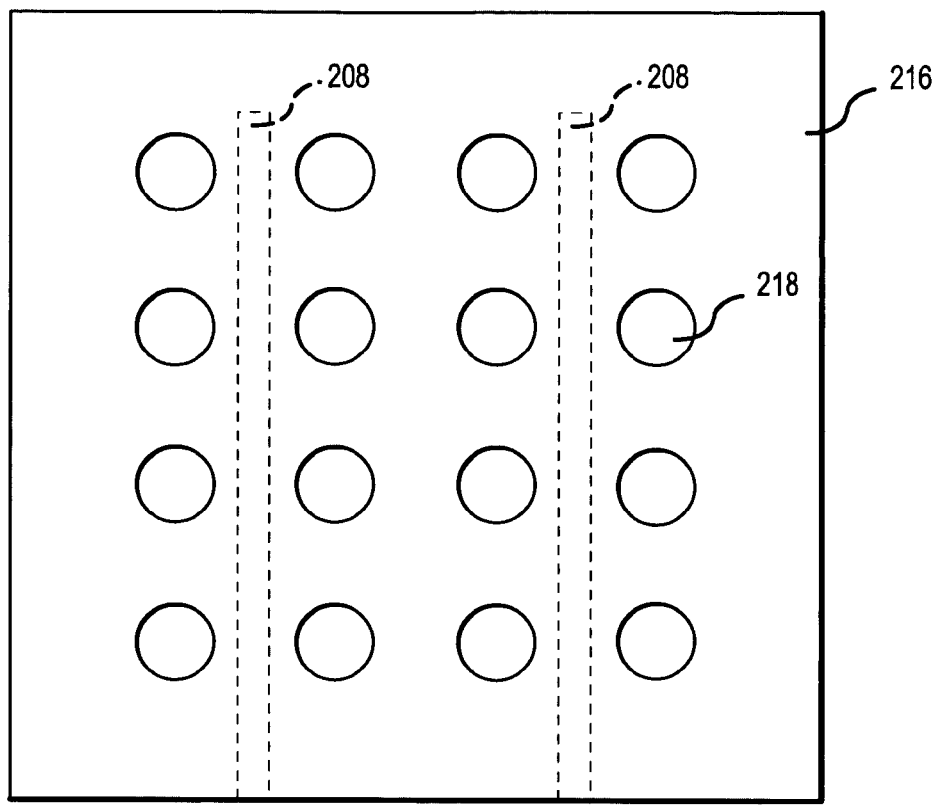
FIG. 15 is a top view of one embodiment of a gas distribution plate/gas tube assembly of the aerosol generator of the present invention.
Figure 16:
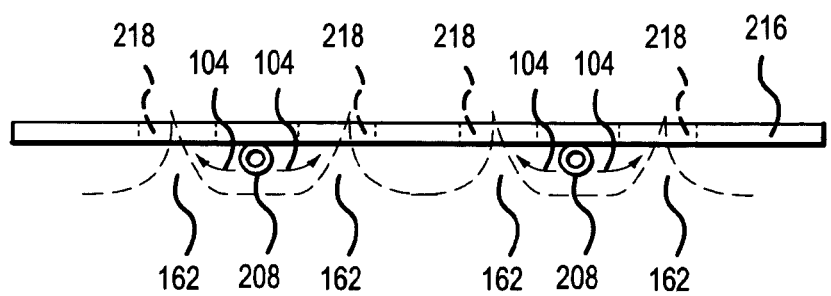
FIG. 16 is a side view of one embodiment of the gas distribution plate/gas tube assembly shown in FIG. 15.

Another configuration for distributing carrier gas in the aerosol generator 106 is shown in FIGS. 15 and 16. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 16, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 15 and 16 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 17:
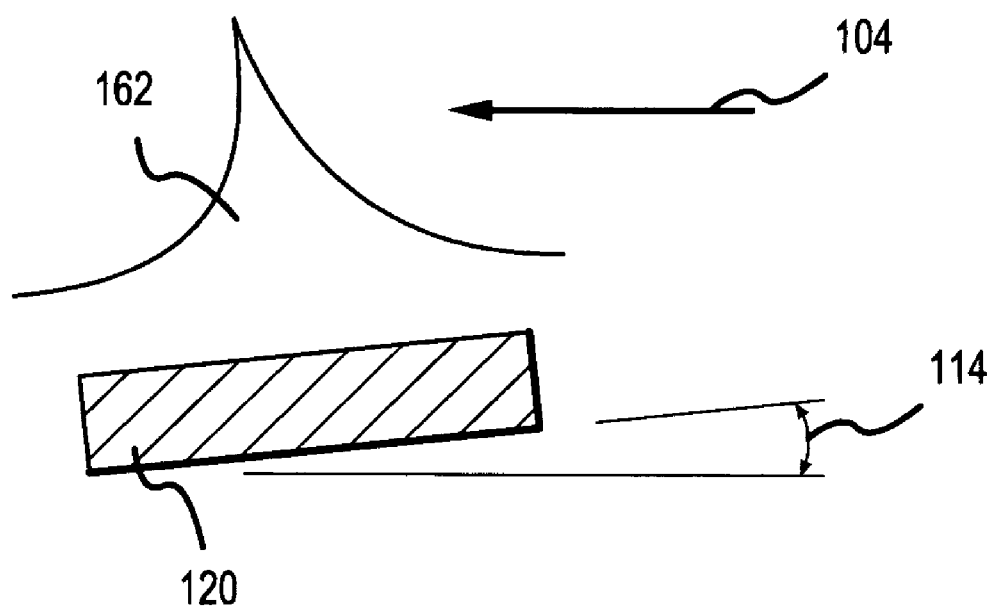
FIG. 17 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 17, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 18:
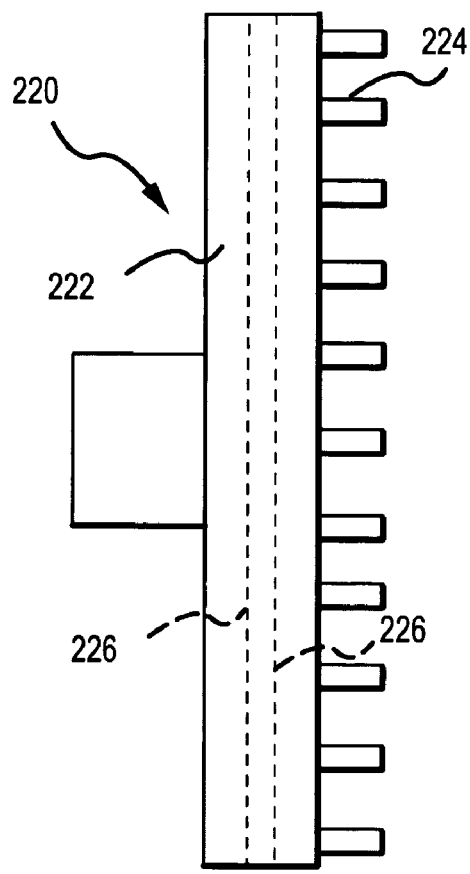
FIG. 18 is a top view of a gas manifold for distributing gas within an aerosol generator of the present invention.
Figure 19:
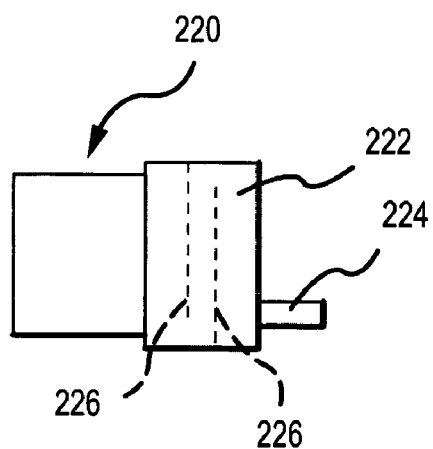
FIG. 19 is a side view of the gas manifold shown in FIG. 18.

Referring now to FIGS. 18 and 19, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 11). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 18 and 19, is designed to feed eleven gas tubes 208. For the 400 transducer design, a total of four gas manifolds 220 are required.

Figure 20:
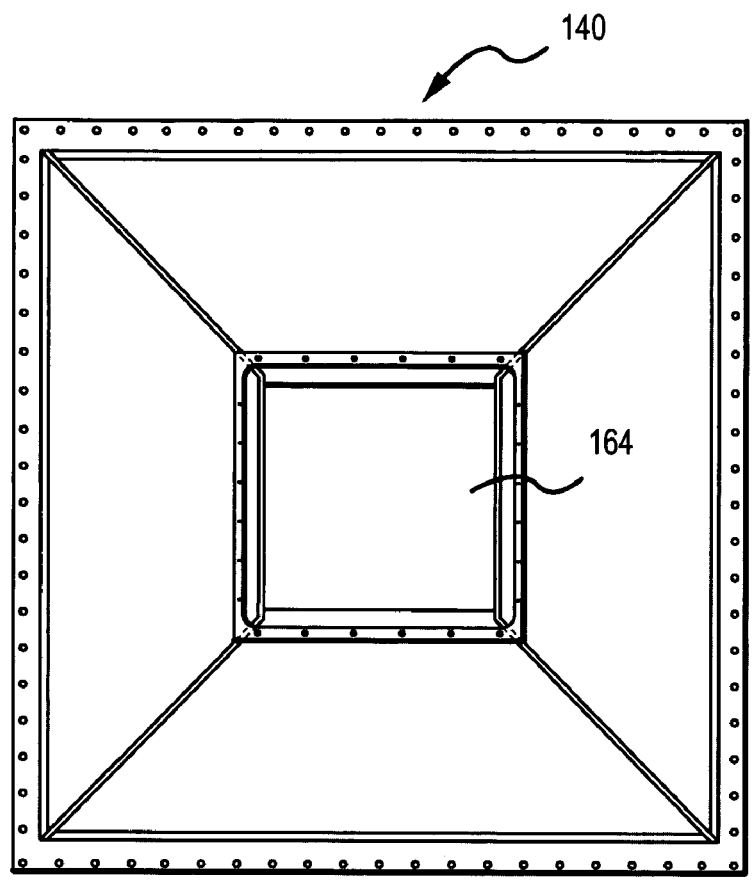
FIG. 20 is a top view of a generator lid of a hood design for use in an aerosol generator of the present invention.
Figure 21:
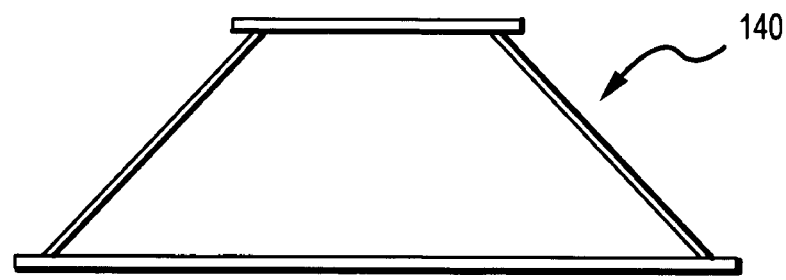
FIG. 21 is a side view of the generator lid shown in FIG. 20.
Figure 23:
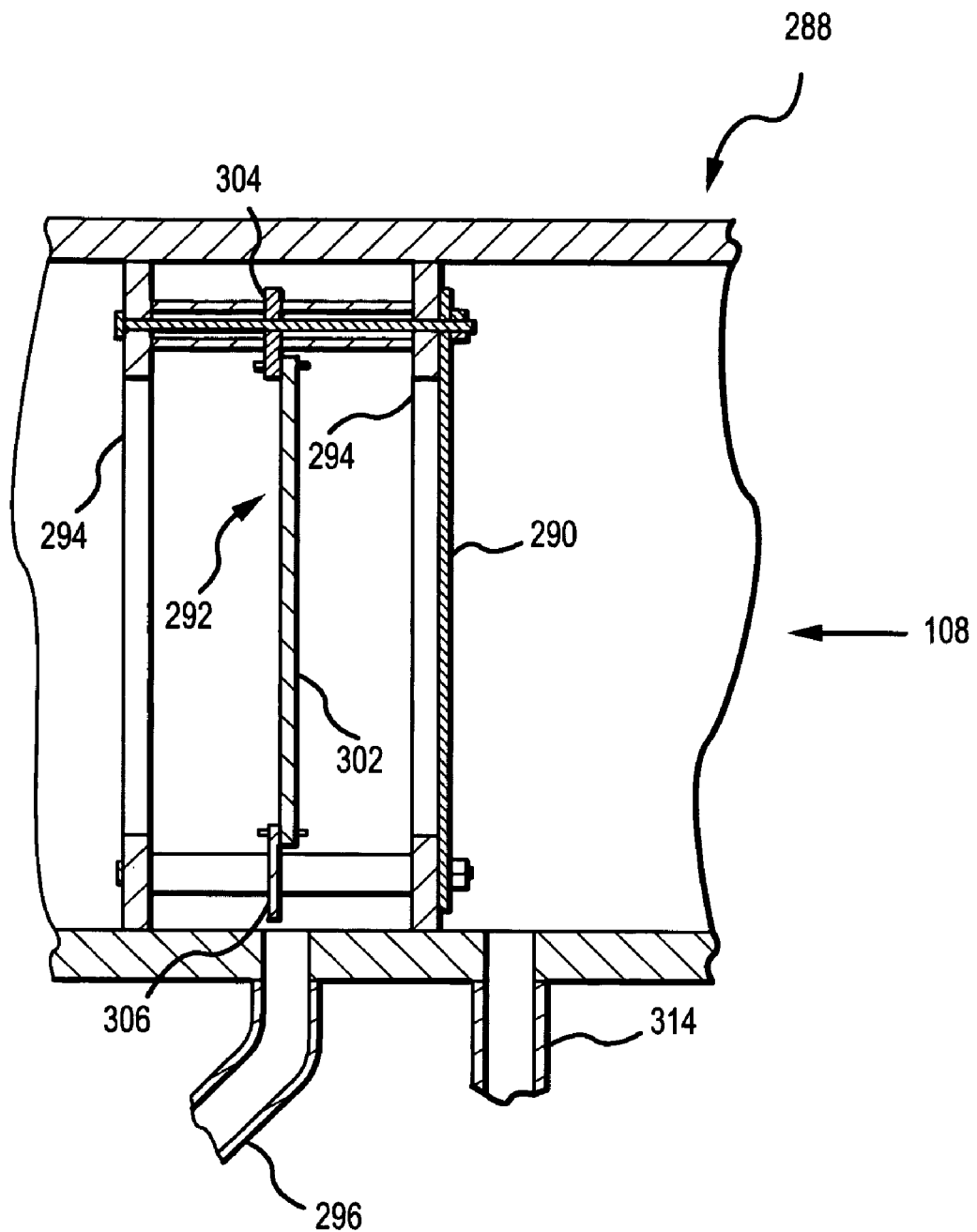
FIG. 23 is a top view in cross section of an impactor of the present invention for use in classifying an aerosol.
Figure 24:
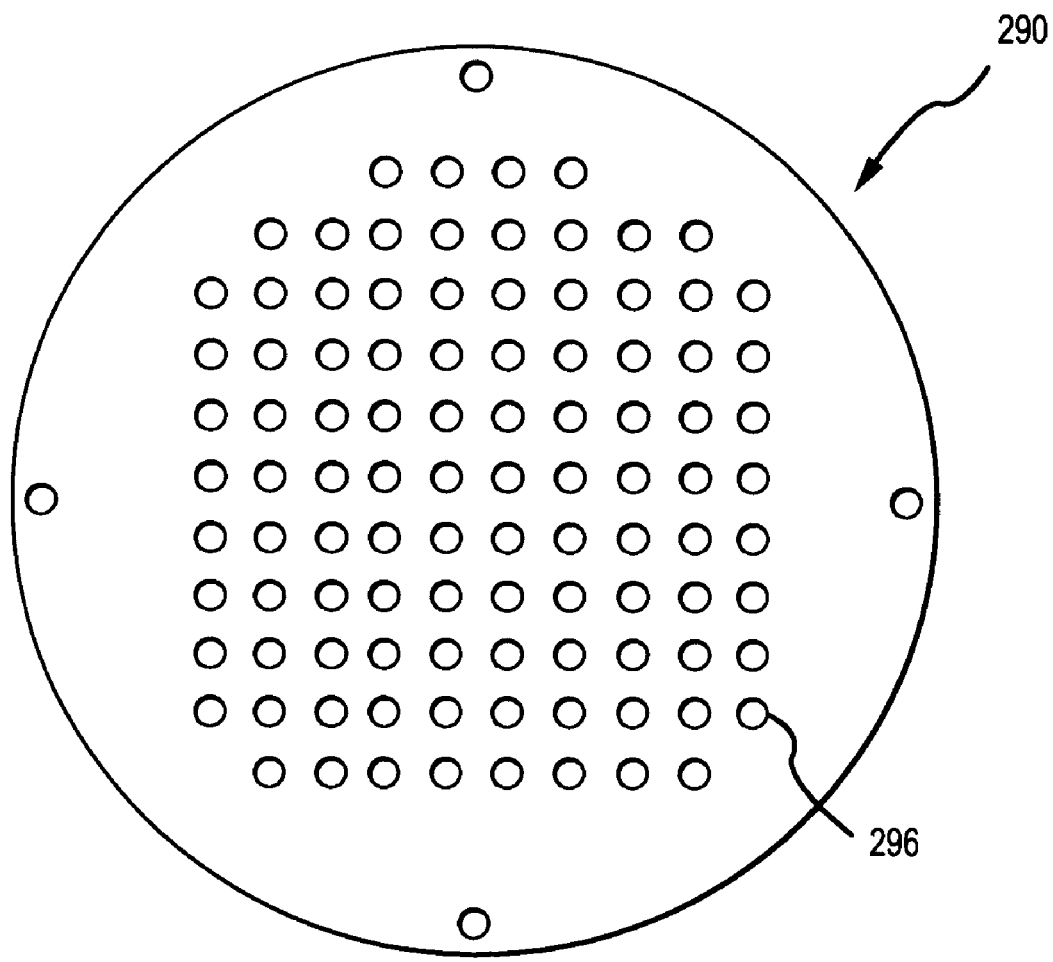
FIG. 24 is a front view of a flow control plate of the impactor shown in FIG. 23.

Referring now to FIGS. 23 and 24, the generator lid 140 is shown for a 400 transducer array design. The generator lid 140 mates with and covers the liquid feed box 190 (shown in FIGS. 9 and 10). The generator lid 140, as shown in FIGS. 20 and 21, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

It is important that the aerosol stream that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

In addition to the foregoing, it has been found to be advantageous according to the present invention to provide means for adjusting the concentration of precursor in the liquid feed. More specifically, it has been found that during aerosol production, the precursor solution can concentrate due to the preferential evaporation of water from the liquid. As a result, it is desirable to provide water to the liquid either on a substantially continuous basis or periodically to maintain the concentration of the precursors within an acceptable range. In some instances, it may also be necessary to add small amounts of precursors if there is any preferential evaporation of precursor materials from the liquid.

The aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 22:
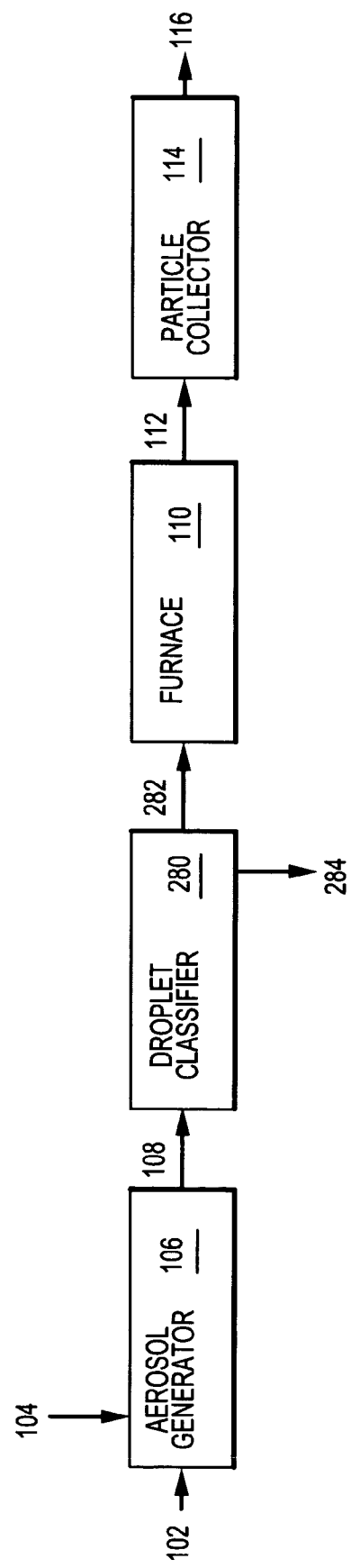
FIG. 22 is a process block diagram of one embodiment of the process of the present invention including a droplet classifier.

Referring now to FIG. 22, a process flow diagram is shown for one embodiment of the process of the present invention including such droplet classification. As shown in FIG. 22, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 23-27.

As seen in FIG. 23, an impactor 288 has disposed in a flow conduit 286 a flow control plate 290 and an impactor plate assembly 292. The flow control plate 290 is conveniently mounted on a mounting plate 294.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 24. The flow control plate 290 has an array of circular flow ports 296 for channeling flow of the aerosol 108 towards the impactor plate assembly 292 with the desired flow characteristics.

Figure 25:
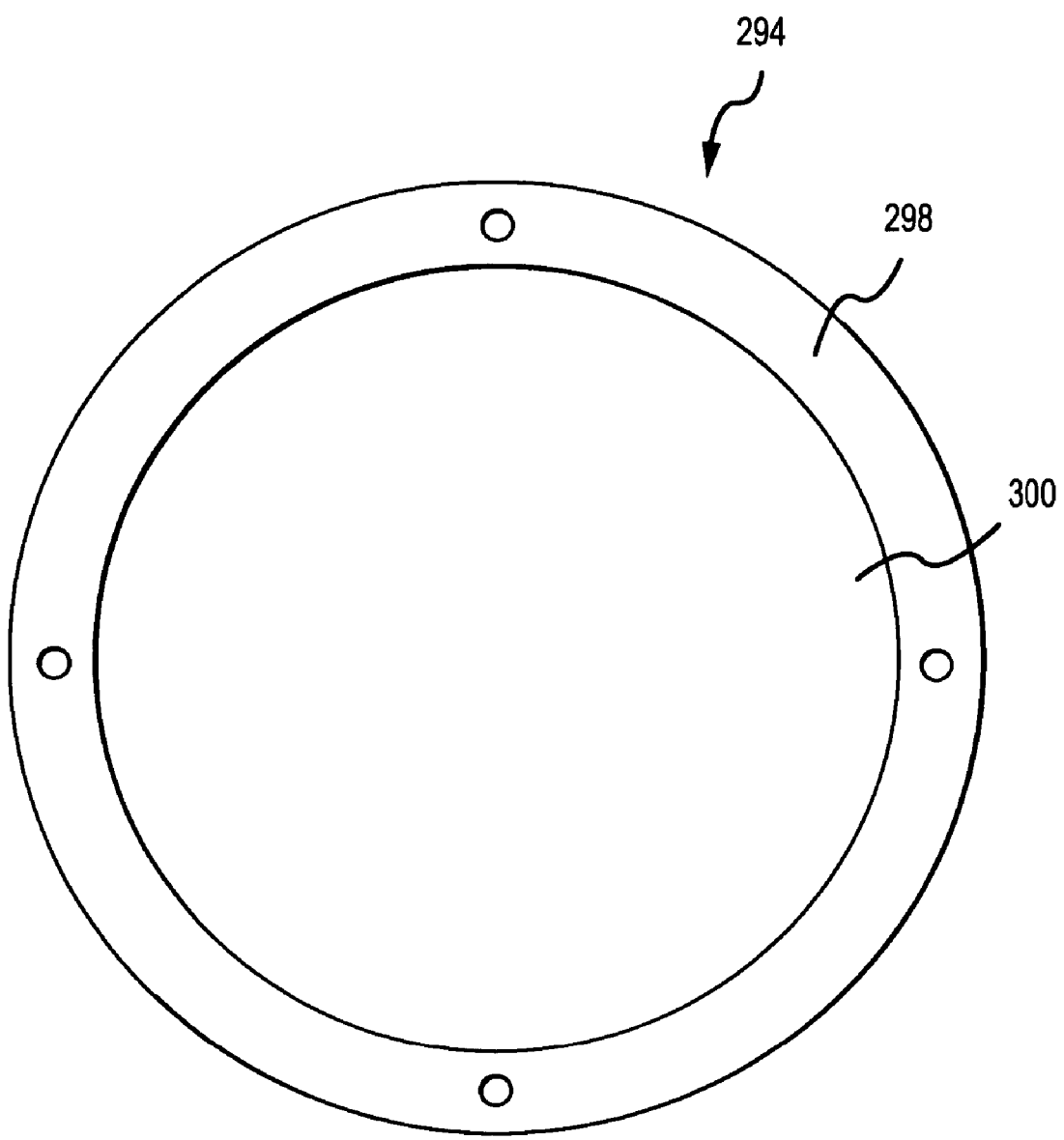
FIG. 25 is a front view of a mounting plate of the impactor shown in FIG. 23.

Details of the mounting plate 294 are shown in FIG. 25. The mounting plate 294 has a mounting flange 298 with a large diameter flow opening 300 passing therethrough to permit access of the aerosol 108 to the flow ports 296 of the flow control plate 290 (shown in FIG. 24).

Figure 26:
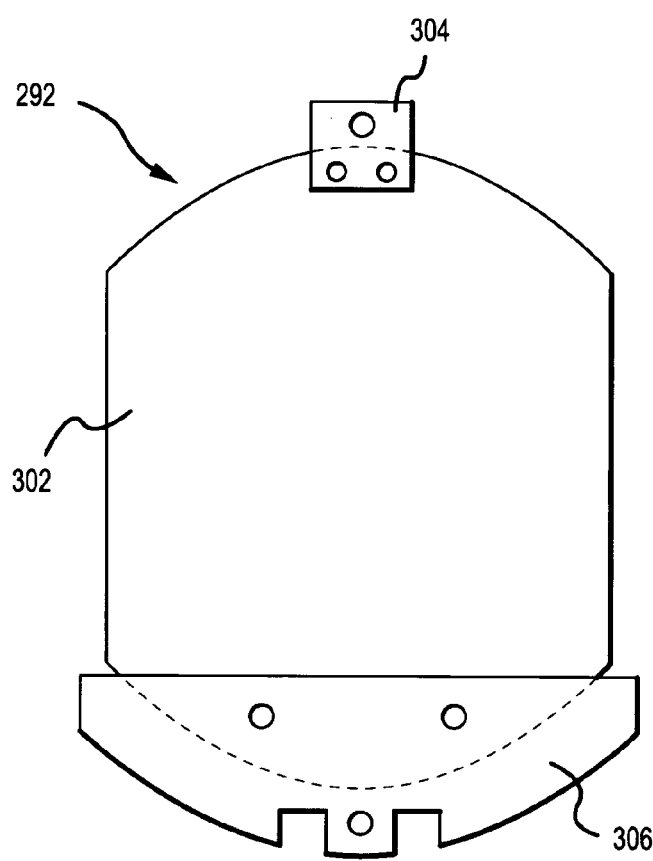
FIG. 26 is a front view of an impactor plate assembly of the impactor shown in FIG. 23.
Figure 27:
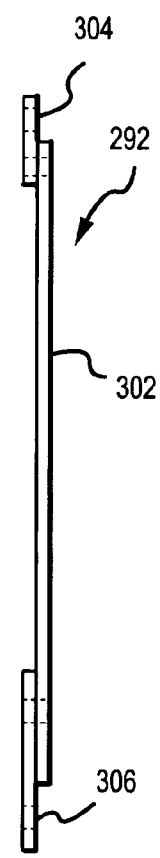
FIG. 27 is a side view of the impactor plate assembly shown in FIG. 26.

Referring now to FIGS. 26 and 27, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 23).

The configuration of the impactor plate 302 shown in FIG. 22 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

In a preferred embodiment of the present invention, the droplet classifier 280 is typically designed to remove droplets from the aerosol 108 that are larger than about 15 μm in size, more preferably to remove droplets larger than about 10 μm in size, even more preferably to remove droplets of a size larger than about 8 μm in size and most preferably to remove droplets larger than about 5 μm in size. The droplet classification size in the droplet classifier is preferably smaller than about 15 μm, more preferably smaller than about 10 μm, even more preferably smaller than about 8 μm and most preferably smaller than about 5 μm. The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. It should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 28, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Referring now to FIGS. 29-31, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 31, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 29-31, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 29, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 29-31, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Referring now to FIG. 32, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 μm, although a series of cyclones may sometimes be needed to get the desired degree of separation. Cyclone separation is particularly preferred for powders having a weight average size of larger than about 1.5 μm. Also, cyclone separation is best suited for high density materials. Preferably, when particles are separated using a cyclone, the particles are of a composition with specific gravity of greater than about 5.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 33. As shown in FIG. 33, the particles 112 exiting from the furnace 110 go to a particle coater 350 where a coating is placed over the outer surface of the particles 112 to form coated particles 352, which are then sent to the particle collector 114 for preparation of the particulate product 116. Coating methodologies employed in the particle coater 350 are discussed in more detail below.

With continued reference primarily to FIG. 33, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater 350 could be an integral extension of the furnace 110 or could be a separate piece of equipment.

In a further embodiment of the present invention, following preparation of the particles 112 in the furnace 110, the particles 112 may then be structurally modified to impart desired physical and chemical properties. Referring now to FIG. 34, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural and/or chemical modification of the particles 112.

The structural modification that occurs in the particle modifier 360 may be any modification to the crystalline structure or morphology of the particles 112. Preferably, the particles 112 are heat treated in the particle modifier 360 to further convert and densify the particles 112 or to recrystallize the particles 112 into a polycrystalline or single crystalline phosphor form. Also, especially in the case of composite particles 112, the particles may be annealed for a sufficient time to permit redistribution within the particles 112 of different material phases. Particularly preferred parameters for such processes are discussed in more detail below.

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 35. These morphologies could be of the particles as initially produced in the furnace 110 or that result from structural modification in the particle modifier 360. Furthermore, the composite particles could include a mixture of the morphological attributes shown in FIG. 35.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generation for the process of the present invention may have a different design depending upon the specific application. For example, when larger particles are desired, such as those having a weight average size of larger than about 3 μm, a spray nozzle atomizer may be preferred. For smaller-particle applications, however, and particularly for those applications to produce particles smaller than about 3 μm, and preferably smaller than about 2 μm in size, as is generally desired with the electroluminescent phosphor particles of the present invention, the ultrasonic generator, as described herein, is particularly preferred. In that regard, the ultrasonic generator of the present invention is particularly preferred for when making particles with a weight average size of from about 0.2 μm to about 3 μm.

Although ultrasonic aerosol generators have been used for medical applications and home humidifiers, use of ultrasonic generators for spray pyrolysis particle manufacture has largely been confined to small-scale, experimental situations. The ultrasonic aerosol generator of the present invention described with reference to FIGS. 5-24, however, is well suited for commercial production of high quality powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 μm to about 10 μm, preferably in a size range of from about 1 μm to about 5 μm and more preferably from about 2 μm to about 4 μm. Also, the ultrasonic generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 millimeters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour of droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7-24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most operating conditions, when using such an aerosol generator, total particulate product produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer. The mass of powder produced per unit time will be influenced by the molecular weight of the compound.

One significant aspect of the process of the present invention for manufacturing particulate materials is the unique flow characteristics encountered in the furnace relative to laboratory scale systems. The maximum Reynolds number attained for flow in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re = \frac{\rho v d}{\mu}$$

where:
ρ=fluid density;
v=fluid mean velocity;
d=conduit inside diameter; and
μ=fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion when heated.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating of the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds 500, more preferably exceeds 1,000, and most preferably exceeds 2,000, the maximum wall temperature in the furnace should be kept at a temperature that is below the temperature at which a desired component of the final particles would exert a vapor pressure not exceeding about 200 millitorr, more preferably not exceeding about 100 millitorr, and most preferably not exceeding about 50 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum stream temperature is reached in the furnace. With the present invention, the average residence time in the heating zone of the furnace may typically be maintained at shorter than about 4 seconds, preferably shorter than about 2 seconds, more preferably shorter than about 1 second, still more preferably shorter than about 0.5 second, and most preferably shorter than about 0.2 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring near the end of the furnace and between the furnace and the cooling unit.

It has been found that thermophoretic losses in the back end of the furnace can be significantly controlled if the heating zone of the furnace is operated such that the maximum stream temperature is not attained until near the end of the heating zone in the furnace, and at least not until the last third of the heating zone. When the heating zone includes a plurality of heating sections, the maximum average stream temperature should ordinarily not occur until at least the last heating section. Furthermore, the heating zone should typically extend to as close to the exit of the furnace as possible. This is counter to conventional thought which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Typically, it would be desirable to instantaneously cool the aerosol upon exiting the furnace. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 700° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second.

Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, typically at a temperature of lower than about 50° C.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes.

One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet to be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Figure 36:
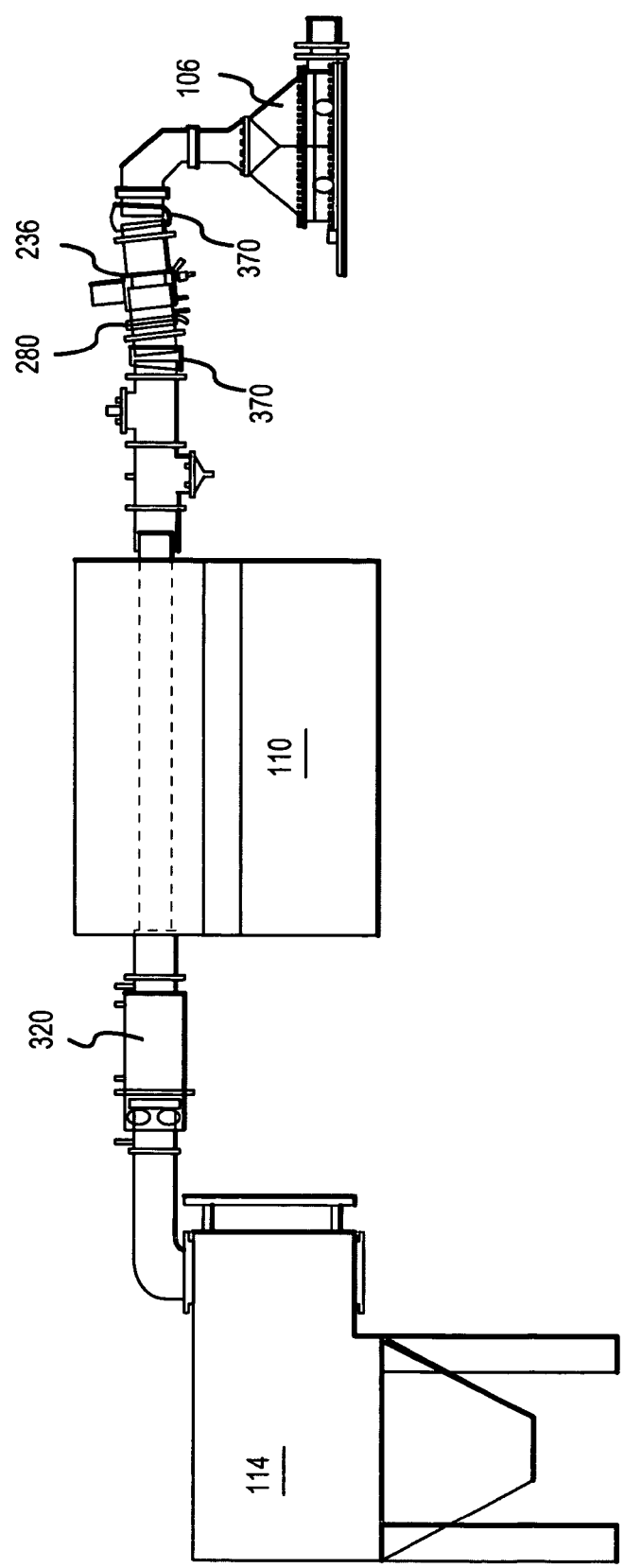
FIG. 36 is a block diagram of one embodiment of the process of the present invention including the addition of a dry gas between the aerosol generator and the furnace.

Another way to reduce the potential for undesirable liquid buildup is to introduce a dry gas into the aerosol between the aerosol generator and the furnace. Referring now to FIG. 36, one embodiment of the process is shown for adding a dry gas 118 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

Figure 29:
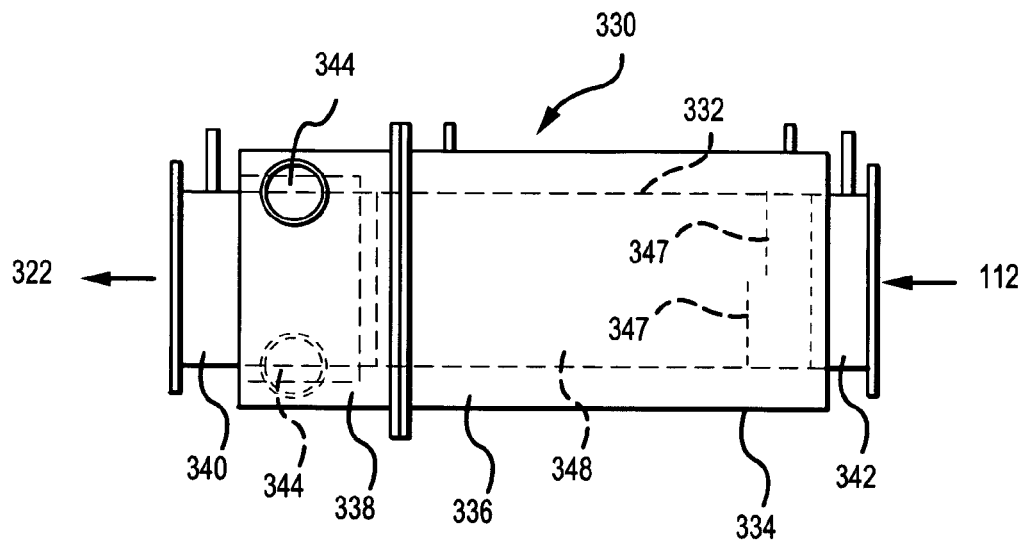
FIG. 29 is a top view of a gas quench cooler of the present invention.
Figures 30, 31:
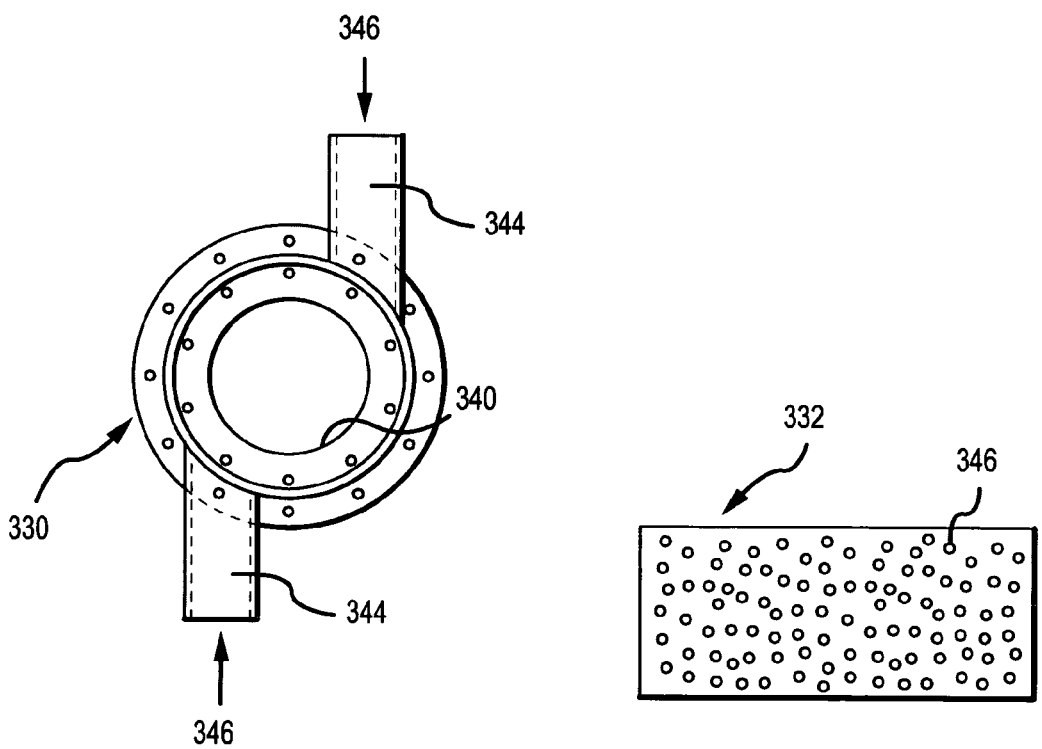
FIG. 30 is an end view of the gas quench cooler shown in FIG. 29.
FIG. 31 is a side view of a perforated conduit of the quench cooler shown in FIG. 29.
Figure 32:
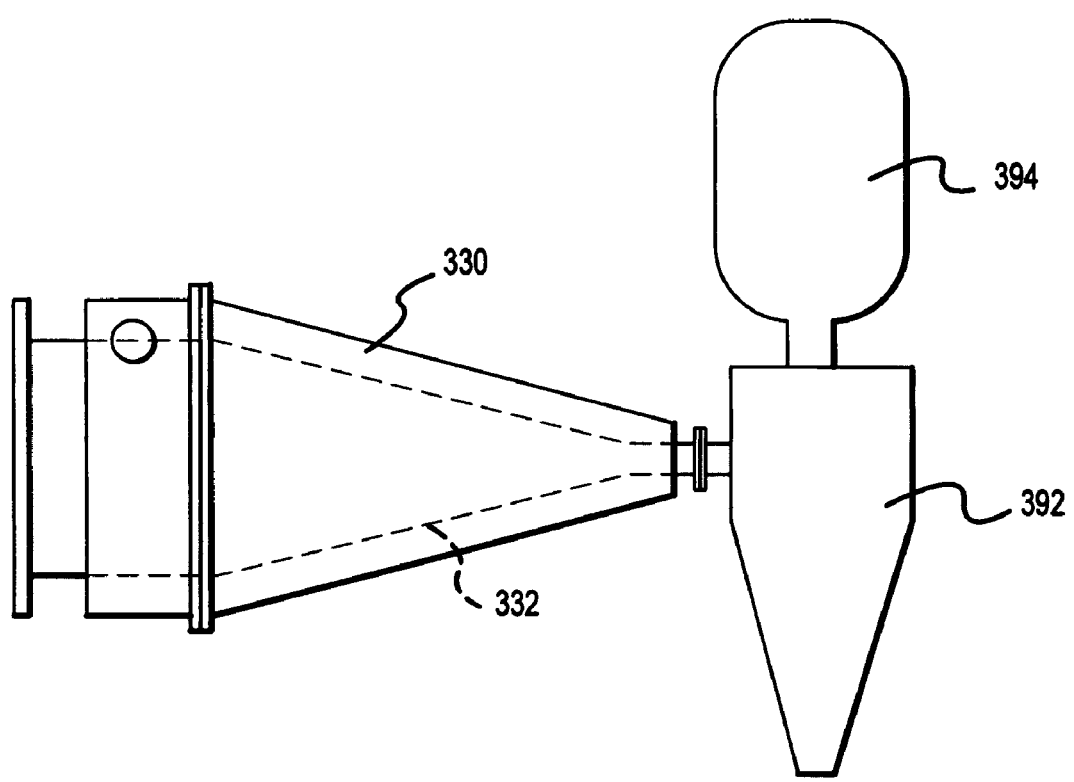
FIG. 32 is a side view showing one embodiment of a gas quench cooler of the present invention connected with a cyclone.
Figure 33:
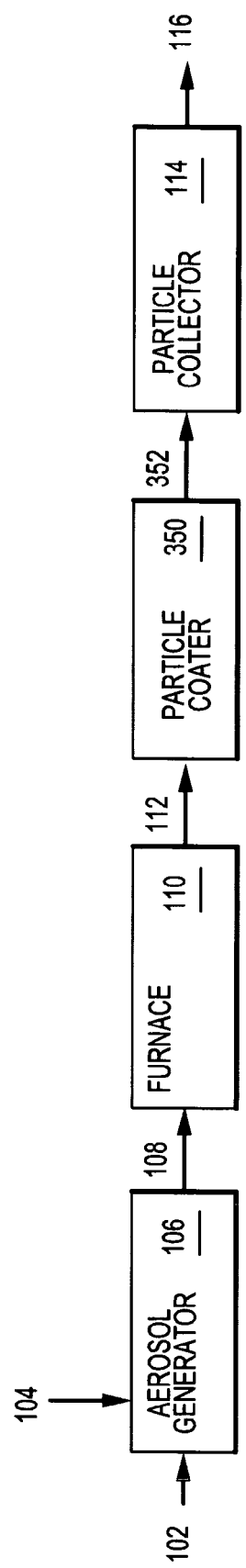
FIG. 33 is a process block diagram of one embodiment of the present invention including a particle coater.
Figure 35A:
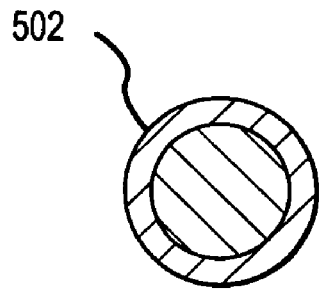
FIG. 35 shows cross sections of various particle morphologies of some composite particles manufacturable according to the present invention.
Figure 35B:
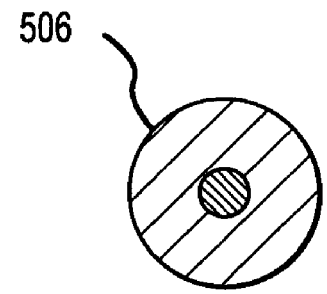
Figure 35C:
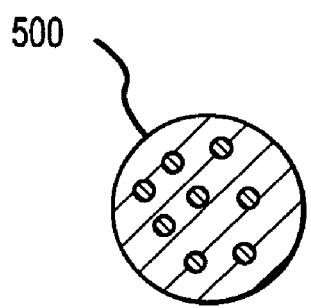
Figure 35D:
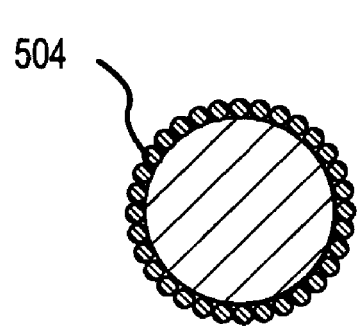
Figure 35E:
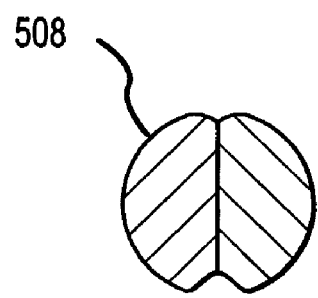
Figure 35F:
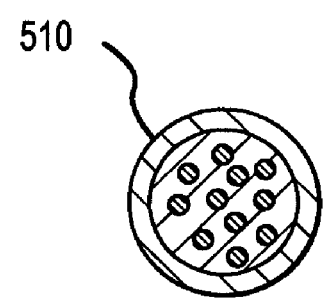

The dry gas 118 will most often be dry air, although in some instances it may be desirable to use dry nitrogen gas or some other dry gas. If a sufficient quantity of the dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 29-31, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 110. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 μm, this vertical flow should, preferably, be vertically upward. For larger-size particles, such as those larger than about 1.5 μm, the vertical flow is preferably vertically downward.

Furthermore, with the process of the present invention, the potential for system losses is significantly reduced because the total system retention time from the outlet of the generator until collection of the particles is typically shorter than about 10 seconds, preferably shorter than about 7 seconds, more preferably shorter than about 5 seconds and most preferably shorter than about 3 seconds.

Many phosphors, particularly electroluminescent phosphors that are useful for electroluminescent lamps and display devices, can be difficult to produce using conventional methods such that the powders have the desirable physical, chemical and luminescent characteristics. Many phosphor compounds can be difficult to produce even using a standard spray pyrolysis technique.

These compounds can advantageously be produced according to the present invention using a process referred to as spray-conversion. Spray-conversion is a process wherein a spray pyrolysis technique, as is described above, is used to produce an intermediate particulate product that is capable of being subsequently converted to a particulate phosphor having the desirable properties. The intermediate product advantageously has many of the desirable morphological properties discussed hereinbelow, such as a small particle size and a narrow particle size distribution.

As is discussed above, precursor materials including water-soluble precursors, such as nitrate salts and insoluble precursors such as colloidal silica, are placed into a liquid solution, atomized and are converted at a relatively low temperature, such as less than about 1000° C., to intermediate precursor particles that typically include low crystallinity oxide phase(s). The intermediate precursor particles have a small size and, preferably, a narrow particle size distribution, as is described in more detail below. The intermediate precursor particles are then converted by further treatment, such as by heat treating at an elevated temperature, to form a phosphor compound having high crystallinity and good luminescence characteristics. The resulting powder advantageously does not require any further milling to reduce particle size or reduce hard agglomerates since the intermediate particles have the desired size and hard agglomeration is avoided during the subsequent heat treatment. The resulting end product is a highly crystalline phosphor powder having the desirable morphological and luminescent properties. The average particle size and morphological characteristics are determined by the characteristics of the intermediate product.

Thus, the precursors can preferably be spray-converted at a temperature of at least about 700° C., such as from about 750° C. to 950° C., to form a homogeneous admixture including one or more oxides having low crystallinity. The intermediate particles can then be heat treated at a temperature of, for example, 1100° C. to 1600° C., to form the phosphor particles having high crystallinity and good luminescent properties.

Particularly preferred electroluminescent phosphors that are produced by spray-conversion according to the present invention include: ZnS doped with Au, Al, or Cu as well as ZnS doped with Ag or Cl and ZnS doped with Mn; $M^1S$ wherein $M^1$ is selected from the group consisting of Ba, Sr and Ca and wherein the particles are doped with Eu or Ce; $M^2Ga_2S_4$ wherein $M^2$ is selected from the group consisting of Ca and Sr and wherein the dopant is Eu or Ce; $ZnGa_2O_4$ doped with Mn or Cr; $M^3Ga_2O_4$ wherein $M^3$ is selected from the group consisting of Ca and Sr and the dopant is selected from the group consisting of Ce and Eu (e.g. $SrGa_xO_y$:Eu); $Y_2O_3$ doped with a rare earth; $Ga_2O_3$ doped with Dy or Eu; $CaGa_xO_y$, such as $Ca_3Ga_2O_6$:Eu or Ce; $Zn_2GeO_4$:Mn; and $Zn_2(Ge,Si)O_4$:Mn.

For the production of the electroluminescent phosphors according to the present invention, the liquid feed includes the chemical components that will form the phosphor particles. For example, the liquid feed can include a solution of metal salts such as nitrates, chlorides, sulfates, hydroxides or oxalates of the phosphor components. In addition, the liquid feed can include particulate precursors such as $SiO_2$. Particulate $SiO_2$ is a preferred precursor for the silicate compounds, and it may be advantageous to provide an excess of silica to obtain phosphor powders having a highly crystalline structure.

A preferred precursor are the nitrates, such as yttrium nitrate, $Y(NO_3)_3 \cdot 6H_2O$, for the production of yttria phosphor particles. Nitrates are typically highly soluble in water and the solutions maintain a low viscosity, even at high concentrations. A typical reaction mechanism for the formation of yttria would be:

$$2Y(NO_3)_3 + H_2O + heat \rightarrow Y_2O_3 + NO_x + H_2O$$

It has been found that the precursor solution should preferably include from about 4 to about 6 weight percent of the precursors.

Zinc sulfide can be produced from a precursor solution including thiourea and zinc nitrate. $Y_5(Ga,Al)_5O_{12}$ can advantageously be produced from a solution comprising all metal salts or can include particulate alumina.

Thiogallates such as $SrGa_2S_4$ can be produced from salts such as nitrate salts and pyrolyzed in air to produce intermediate precursor particles that are composed mainly of low crystallinity oxides such as $SrGa_2O_4$. The intermediate precursor particles are then treated in a sulfur-containing atmosphere to convert the oxides to the sulfide phase.

Oxide based electroluminescent phosphors can typically be produced from simple metal salts. For example, $SrGa_xO_y$ can be produced from strontium carbonate and gallium nitrate and $CaGa_xO_y$ can be produced from calcium carbonate and gallium nitrate.

The solution is preferably not saturated with the precursor to avoid precipitate formation in the liquid. The solution preferably includes, for example, sufficient precursor to yield from about 1 to 50 weight percent, such as from about 1 to 15 weight percent, of the phosphor compound. That is, the solution concentrations are measured based on the equivalent weight percent of the phosphor product. The final particle size of the phosphor particles is also influenced by the precursor concentration. Generally, lower precursor concentrations in the liquid feed will produce particles having a smaller average size.

As is discussed above, the liquid feed preferably includes the dopant (activator ion) precursor, typically a soluble metal salt such as a nitrate. The relative concentrations of the precursors can be adjusted to vary the concentration of the activator ion in the host material.

Preferably, the solvent is aqueous-based for ease of operation, although other solvents, such as toluene, may be desirable. However, the use of organic solvents can lead to undesirable carbon contamination in the phosphor particles. The pH of the aqueous-based solutions can be adjusted to alter the solubility characteristics of the precursors in the solution.

In addition to the foregoing, the liquid feed may also include other additives that contribute to the formation of the particles. For example, a fluxing agent can be added to the solution to increase the crystallinity and/or density of the particles. The addition of urea to metal salt solutions, such as a metal nitrate, can increase the density of particles produced from the solution. In one embodiment, up to about 1 mole equivalent urea is added to the precursor solution, as measured against the moles of phosphor compound in the metal salt solution. Small amounts, e.g. less than 1 weight percent, of boric acid added to a precursor solution can also enhance crystallinity without substantially altering the composition of the powder. Further, if the particles are to be coated phosphor particles, as is discussed in more detail below, a soluble precursor to both the phosphor compound and the coating can be used in the precursor solution wherein the coating precursor is an involatile or volatile species.

For producing the electroluminescent phosphor particles, the carrier gas may comprise any gaseous medium in which droplets produced from the liquid feed may be dispersed in aerosol form. Also, the carrier gas may be inert, in that the carrier gas does not participate in formation of the phosphor particles. Alternatively, the carrier gas may have one or more active component(s) that contribute to formation of the phosphor particles. In that regard, the carrier gas may include one or more reactive components that react in the furnace to contribute to formation of the phosphor particles. In many applications for the spray-conversion of phosphor particles according to the present invention, air will be a satisfactory carrier gas for providing oxygen. In other instances, a relatively inert gas such as nitrogen may be required.

When the phosphors of the present invention are coated phosphors, precursors to metal oxide coatings can be selected from volatile metal acetates, chlorides, alkoxides or halides. Such precursors are known to react at high temperatures to form the corresponding metal oxides and eliminate supporting ligands or ions. For example, $SiCl_4$ can be used as a precursor to $SiO_2$ coatings when water vapor is present:

$$SiCl_{4(g)}+2H_2O_{(g)}\rightarrow SiO_{2(s)}+4HCl_{(g)}$$

$SiCl_4$ also is highly volatile and is a liquid at room temperature, which makes transport into the reactor more controllable.

Metal alkoxides can be used to produce metal oxide films by hydrolysis. The water molecules react with the alkoxide M—O bond resulting in clean elimination of the corresponding alcohol with the formation of M—O—M bonds:

$$Si(OEt)_4+2H_2O\rightarrow SiO_2+4EtOH$$

Most metal alkoxides have a reasonably high vapor pressure and are therefore well suited as coating precursors.

Metal acetates are also useful as coating precursors since they readily decompose upon thermal activation by acetic anhydride elimination:

$$Mg(O_2CCH_3)_2\rightarrow MgO+CH_3C(O)OC(O)CH_3$$

Metal acetates are advantageous as coating precursors since they are water stable and are reasonably inexpensive.

Coatings can be generated on the particle surface by a number of different mechanisms. One or more precursors can vaporize and fuse to the hot phosphor particle surface and thermally react resulting in the formation of a thin-film coating by chemical vapor deposition (CVD). Preferred coatings deposited by CVD include metal oxides and elemental metals. Further, the coating can be formed by physical vapor deposition (PVD) wherein a coating material physically deposits on the surface of the particles. Preferred coatings deposited by PVD include organic materials and elemental metals. Alternatively, the gaseous precursor can react in the gas phase forming small particles, for example less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions such as precursor partial pressure, water partial pressure and the concentration of particles in the gas stream. Another possible surface coating method is surface conversion of the surface of the particle by reaction with a vapor phase reactant to convert the surface of the particles to a different material than that originally contained in the particles.

In addition, a volatile coating material such as PbO, $MoO_3$ or $V_2O_5$ can be introduced into the reactor such that the coating deposits on the particle by condensation. Highly volatile metals, such as silver, can also be deposited by condensation. Further, the phosphor powders can be coated using other techniques. For example, a soluble precursor to both the phosphor powder and the coating can be used in the precursor solution wherein the coating precursor is involatile (e.g. $Al(NO_3)_3$) or volatile (e.g. $Sn(OAc)_4$ where OAc is acetate). In another method, a colloidal precursor and a soluble phosphor precursor can be used to form a particulate colloidal coating on the phosphor.

The phosphor powders produced by the foregoing method may be fully converted to the crystalline phosphor compound during the pyrolization step. However, it is preferred that the powders are spray-converted to an intermediate form. It is then necessary to heat the spray-converted intermediate precursor particles to convert the intermediate precursor powder to a luminescent phosphor compound and to increase the crystallinity (average crystallite size) of the powder. Thus, the powders can be heat-treated for an amount of time and in a preselected environment, as is discussed above. Increased crystallinity can advantageously yield an increased brightness and efficiency of the phosphor particles. If such heat treating steps are performed, the heat treating temperature and time should be selected to minimize the amount of interparticle sintering. Table I illustrates examples of preferred phosphor powders according to the present invention with the preferred conversion and heat treatment conditions.

TABLE I

Examples of Spray-Converted Phosphor Compounds

| Host Material | Conversion Temperature (pyrolization) | Carrier Gas | Heat Treatment Temperature | Heat Treatment Gas |
|---|---|---|---|---|
| $Y_2O_3$ | 850–1000° C. | Air | 1350–1500° C. | Air |
| ZnS | 300–900° C. | $N_2$ | 500–900° C. | $H_2S/N_2$ |
| $SrGa_2S_4$ | 700–900° C. | Air | 800–1100° C. | $H_2S/N_2$ |
| $SrGa_xO_y$ | 700–900° C. | Air | 1100–1450° C. | Air |
| $CaGa_xO_y$ | 700–900° C. | Air | 1100–1450° C. | Air |

The heat treatment time is preferably not more than about 2 hours and can be as little as about 1 minute. To reduce agglomeration, the intermediate particles are preferably heat treated under sufficient agitation to minimize the agglomeration of the particles. One preferred method for agitating during heat treatment is to heat treat the powders in a rotary kiln, wherein the powders are constantly moving through a tubular furnace that is rotating on its major axis.

Further, the crystallinity of the phosphors can be increased by using a fluxing agent, either in the precursor solution or in a post-formation annealing step. A fluxing agent is a reagent which improves the crystallinity of the material when the reagent and the material are heated together, as compared to heating the material to the same temperature and for the same amount of time in the absence of the fluxing agent. The fluxing agents typically cause a eutectic to form which leads to a liquid phase at the grain boundaries, increasing the diffusion coefficient. The fluxing agent, for example alkali metal halides such as NaCl or KCl or an organic compound such as urea ($CO(NH_2)_2$), can be added to the precursor solution where it improves the crystallinity and/or density of the particles during their subsequent formation. Alternatively, the fluxing agent can be contacted with the phosphor powder batches after they have been collected. Upon heat treatment, the fluxing agent improves the crystallinity of the phosphor powder, and therefore improves other properties such as the brightness of the phosphor powder. Also, in the case of composite particles, the particles may be annealed for a sufficient time to permit redistribution within the particles of different material phases.

Phosphors typically include a matrix compound, referred to as a host material, and the phosphor further includes one or more dopants, referred to as activator ions, to emit a specific color or to enhance the luminescence characteristics.

The phosphor host material can be doped with an activator ion, typically in an amount of from about 0.02 to about 20 atomic percent. The preferred concentration of the activator ion will vary depending on the composition and the application of the phosphor, as is discussed in more detail below. The activator ion should also be in the proper oxidation state.

One advantage of the present invention is that the activator ion is homogeneously distributed throughout the host material. Phosphor powders prepared by solid-state methods do not give uniform concentration of the activator ion in small particles and solution routes also do not give homogenous distribution of the activator ion due to different rates of precipitation.

The powder characteristics that are preferred will depend upon the application of the electroluminescent phosphor powders. Nonetheless, it can be generally stated for most applications that the powders should have a small particle size, narrow size distribution, spherical morphology, high density/low porosity, high crystallinity and homogenous dopant distribution of activator ion throughout the host material. The efficiency of the phosphor, defined as the overall conversion of excitation energy to visible photons, should be high.

According to the present invention, the phosphor powder includes particles having a small particle average size. Although the preferred average size of the phosphor particles will vary according to the application of the phosphor powder, the average particle size of the phosphor particles is at least about 0.1 µm and not greater than about 10 µm. For most applications, the average particle size is preferably not greater than about 5 µm, such as from about 0.3 µm to about 5 µm and more preferably is not greater than about 3 µm, such as from about 0.3 µm to about 3 µm. As used herein, the average particle size is the weight average particle size.

According to the present invention, the powder batch of phosphor particles also has a narrow particle size distribution, such that the majority of particles are substantially the same size. Preferably, at least about 80 weight percent of the particles and more preferably at least about 90 weight percent of the particles are not larger than twice the average particle size. Thus, when the average particle size is about 2 µm, it is preferred that at least about 80 weight percent of the particles are not larger than 4 µm and it is more preferred that at least about 90 weight percent of the particles are not larger than 4 µm. Further, it is preferred that at least about 80 weight percent of the particles, and more preferably at least about 90 weight percent of the particles, are not larger than about 1.5 times the average particle size. Thus, when the average particle size is about 2 µm, it is preferred that at least about 80 weight percent of the particles are not larger than about 3 µm and it is more preferred that at least about 90 weight percent of the particles are not larger than about 3 µm.

Powders produced by the processes described herein, particularly those that have experienced a post treatment step, generally exit as soft agglomerates of primary spherical particles. It is well known to those in the art that micrometer-sized particles often form soft agglomerates as a result of their relatively high surface energy, as compared to larger particles. It is also known to those skilled in the art that such soft agglomerates may be dispersed easily by treatments such as exposure to ultrasound in a liquid medium or sieving. The average particle size and particle size distributions described herein are measured by mixing samples of the powders in a medium such as water with a surfactant and a short exposure to ultrasound through either an ultrasonic bath or horn. The ultrasonic treatment supplies sufficient energy to disperse the soft agglomerates into primary spherical particles. The primary particle size and size distribution is then measured by light scattering in a Microtrac instrument. This provides a good measure of the useful dispersion characteristics of the powder because this simulates the dispersion of the particles in a liquid medium such as a paste or slurry that is used to deposit the particles in a device, such as an electroluminescent display device. Thus, the references to particle size herein refer to the primary particle size, such as after lightly dispersing the soft agglomerates of particles.

Further, it is advantageous according to the present invention that the foregoing description of the average size and size distribution of the phosphor particles also applies to the intermediate precursor particles that are produced during the pyrolization step. That is, the size and size distribution of the particles changes very little, if at all, during the heat treatment step after pyrolization. The morphological properties of the final phosphor powder are substantially controlled by the properties of the intermediate precursor particles.

The phosphor particles of the present invention are comprised of a number of crystallites. According to the present invention, the phosphor particles are highly crystalline and it is preferred that the average crystallite size approaches the average particle size such that the particles are composed of only a few large crystals. The average crystallite size of the particles is preferably at least about 25 nanometers, more preferably is at least about 40 nanometers, even more preferably is at least about 60 nanometers and most preferably is at least about 80 nanometers. In one embodiment, the average crystallite size is at least about 100 nanometers. As it relates to particle size, the average crystallite size is preferably at least about 10 percent, more preferably at least about 20 percent and most preferably is at least about 30 percent of the average particle size. Such highly crystalline phosphors are believed to have increased luminescent efficiency and brightness as compared to phosphor particles having smaller crystallites.

The phosphor particles of the present invention advantageously have a high degree of purity, that is, a low level of impurities. Impurities are those materials that are not intended in the final product and that negatively affect the properties of the phosphor. Thus, an activator ion is not considered an impurity. The level of impurities in the phosphor powders of the present invention is preferably not greater than about 1 atomic percent, more preferably is not greater than about 0.1 atomic percent and even more preferably is not greater than about 0.01 atomic percent. It will be appreciated that some of the phosphor particles according to the present invention will include a second-phase that does not hinder the properties of the phosphor. For example, the $Zn_2SiO_4$ phosphor particles of the present invention are advantageously produced using a slight excess of silica, and therefore the particle will include silica crystallites dispersed throughout the $Zn_2SiO_4$. Such a second phase is not considered an impurity.

The formation of hollow particles is common in spray pyrolysis and can occur in spray conversion. Hollow phosphor particles may be detrimental in a number of applications of phosphor powders. In the present invention, it has been found that the formation of hollow particles can be avoided through a combination of the control over pyrolysis temperature, residence time and solution concentration. For example, with constant pyrolysis temperature and residence time, the morphology of some powders show the presence of progressively more hollow particles as the solution concentration is raised above 5 weight percent. Thus, the phosphor particles are preferably very dense (not porous) as measured by helium pycnometry. Preferably, the particles have a particle density of at least about 80 percent of the theoretical density, more preferably at least about 90 percent of the theoretical density, and even more preferably at least about 95 percent of the theoretical density.

The phosphor particles of the present invention are also substantially spherical in shape. That is, the particles are not jagged or irregular in shape. Spherical particles are particularly advantageous because they are able to disperse and coat a device, such as an electroluminescent lamps or display device, more uniformly with a reduced average thickness. Although the particles are substantially spherical, the particles may become faceted as the crystallite size increases while maintaining a substantially spherical morphology.

In addition, the phosphor particles according to the present invention advantageously have a low surface area. The particles are substantially spherical, which reduces the total surface area for a given mass of powder. Further, the elimination of larger particles from the powder batches eliminates the porosity that is associated with open pores on the surface of such larger particles. Due to the elimination of the large particles, the powder advantageously has a lower surface area. Surface area is typically measured using a BET nitrogen adsorption method which is indicative of the surface area of the powder, including the surface area of accessible surface pores on the surface of the powder. For a given particle size distribution, a lower value of a surface area per unit mass of powder indicates solid or non-porous particles. Decreased surface area reduces the susceptibility of the phosphor powders to adverse surface reactions, such as degradation from moisture. This characteristic can advantageously extend the useful life of the phosphor powders.

The surfaces of the phosphor particles according to the present invention are typically smooth and clean with a minimal deposition of contaminants on the particle surface. For example, the outer surfaces are not contaminated with surfactants, as is often the case with particles produced by liquid precipitation routes. Since the particles do not require milling, the particle surfaces do not include major defects that typically result from milling and can decrease the brightness of the powders.

In addition, the powder batches of phosphor particles according to the present invention are substantially unagglomerated, that is, they include substantially no hard agglomerates or particles. Hard agglomerates are physically coalesced lumps of two or more particles that behave as one large particle. Hard agglomerates are disadvantageous in most applications of phosphor powders. It is preferred that no more than about 1 weight percent of the phosphor particles in the powder batch of the present invention are in the form of hard agglomerates. More preferably, no more than about 0.5 weight percent of the particles are in the form of hard agglomerates and even more preferably no more than about 0.1 weight percent of the particles are in the form of hard agglomerates. In the event that hard agglomerates of the powder do form, they can optionally be broken up, such as by jet-milling the powder.

According to one embodiment of the present invention, the phosphor particles are composite phosphor particles, wherein the individual particles include at least a first phosphor phase and at least a second phase associated with the phosphor phase. The second phase can be a different phosphor compound or can be a non-phosphor compound. Examples include metal oxides or metal sulfides, including rare earth oxides or rare earth sulfides. Such composites can advantageously permit the use of phosphor compounds in devices that would otherwise be unusable. Further, combinations of different phosphor compounds within one particle can produce emission of a selected color. The emission of the two phosphor compounds would combine to approximate white light.

According to another embodiment of the present invention, the phosphor particles are surface modified or coated phosphor particles that include a particulate coating (FIG. 35d) for non-particulate (film) coating (FIG. 35a) that substantially encapsulates an outer surface of the particles. The coating can be a metal, a non-metallic compound or an organic compound.

Coatings are often desirable to reduce degradation of the phosphor powder due to moisture or other influences. The thin, uniform coatings according to the present invention will advantageously permit use of the phosphor powders under corrosive conditions. Coatings also create a diffusion barrier such that activator ions cannot transfer from one particle to another, thereby altering the luminescence characteristics. Coatings can also control the surface energy levels of the particles.

The coating can be a metal, metal oxide or other inorganic compound such as a metal sulfide, or can be an organic compound. For example, a metal oxide coating can advantageously be used, such as a metal oxide selected from the group consisting of $SiO_2$, $MgO$, $Al_2O_3$, $ZnO$, $SnO_2$ or $In_2O_3$. Particularly preferred are $SiO_2$ and $Al_2O_3$ coatings. Semiconductive oxide coatings such as $SnO_2$ or $In_2O_3$ can be advantageous in some applications. In addition, phosphate coatings, such as zirconium phosphate or aluminum phosphate, can also be advantageous for use in some applications.

The coatings should be relatively thin and uniform. The coating should encapsulate the entire particle, but be sufficiently thin such that the coating does not substantially interfere with light transmission. Preferably, the coating has an average thickness of not greater than about 200 nanometers, more preferably not greater than about 100 nanometers, and even more preferably not greater than about 50 nanometers. The coating preferably completely encapsulates the phosphor particle and therefore should have an average thickness of at least about 2 nanometers, more preferably at least about 5 nanometers. In one embodiment, the coating has a thickness of from about 2 to 50 nanometers, such as from about 2 to 10 nanometers. Further, the particles can include more than one coating substantially encapsulating the particles to achieve the desired properties.

The coating, either particulate or non-particulate, can also include a pigment or other material that alters the light characteristics of the phosphor. Red pigments can include compounds such as the iron oxides ($Fe_2O_3$), cadmium sulfide compounds (CdS) or mercury sulfide compounds (HgS). Green or blue pigments include cobalt oxide (CoO), cobalt aluminate ($CoAl_2O_4$) or zinc oxide (ZnO). Pigment coatings are capable of absorbing selected wavelengths of light leaving the phosphor, thereby acting as a filter to improve the color contrast and purity. Further, a dielectric coating, either organic or inorganic, can be used to achieve the appropriate surface charge characteristics to carry out deposition processes such as electrostatic deposition.

In addition, the phosphor particles can be coated with an organic compound such as PMMA (polymethylmethacrylate), polystyrene or similar organic compounds, including surfactants that aid in the dispersion and/or suspension of the particles in a flowable medium. The organic coating is preferably not greater than about 100 nanometers thick and is substantially dense and continuous about particle. The organic coatings can advantageously prevent corrosion of the phosphor particles and also can improve the dispersion characteristics of the particles in a paste or other flowable medium.

The coating can also be comprised of one or more monolayer coatings, such as from about 1 to 3 monolayer coatings. A monolayer coating is formed by the reaction of an organic or an inorganic molecule with the surface of the phosphor particles to form a coating layer that is essentially one molecular layer thick. In particular, the formation of a monolayer coating by reaction of the surface of the phosphor powder with a functionalized organo silane such as halo- or amino-silanes, for example hexamethyldisilazane or trimethylsilylchloride, can be used to modify and control the hydrophobicity and hydrophilicity of the phosphor powders.

Monolayer coatings of metal oxides (e.g. ZnO or $SiO_2$) or metal sulfides (e.g. $Cu_2S$) can be formed as monolayer coatings. Monolayer coatings can allow for greater control over the dispersion characteristics of the phosphor powder in a wide variety of paste compositions and other flowable mediums.

The monolayer coatings may also be applied to phosphor powders that have already been coated with an organic or inorganic coating, thus providing better control over the corrosion characteristics (through the use of a thicker coating) as well as dispersibility (through the use of a monolayer coating) of the phosphor powder.

As a direct result of the foregoing powder characteristics, the electroluminescent phosphor powders of the present invention have many unique and advantageous properties that are not found in electroluminescent phosphor powders known heretofore.

The electroluminescent phosphor powders of the present invention have a high efficiency, sometimes referred to as quantum efficiency. Efficiency is the overall conversion of excitation energy to visible photons emitted. The high efficiency of the phosphor powders according to the present invention is believed to be due to the high crystallinity and homogenous distribution of activator ion in the host material as well as a substantially defect-free particle surface.

The phosphor powders also have well-controlled color characteristics, sometimes referred to as emission spectrum characteristics or chromaticity. This important property is due to the ability to precisely control the composition of the host material, the homogenous distribution of the activator ion and the high purity of the powders.

The phosphor powders also have improved decay time, also referred to as persistence. Persistence is referred to as the amount of time for the light emission to decay to 10% of its brightness. Phosphors with long decay times can result in blurred images when the image moves across the display. The improved decay time of the phosphor powders of the present invention is believed to be due primarily to the homogenous distribution of activator ion in the host material.

The phosphor powders also can have an improved brightness over prior art phosphor powders. That is, under a given application of electroluminescent energy, the phosphor powders of the present invention produce more light.

Thus, the phosphor powders of the present invention have a unique combination of properties that are not found in conventional phosphor powders. The powders can advantageously be used to form a number of intermediate products, for example liquid mediums such as pastes or slurries, and can be incorporated into a number of devices, wherein the devices will have significantly improved performance resulting directly from the characteristics of the electroluminescent phosphor powders of the present invention. The devices can include electroluminescent lamps and display devices.

Phosphor powders are typically deposited onto device surfaces or substrates by a number of different deposition methods which involve the direct deposition of the dry powder such as dusting, electrophotographic or electrostatic precipitation, while other deposition methods involve liquid vehicles such as ink jet printing, liquid delivery from a syringe, micro-pens, toner, slurry deposition, paste-based methods and electrophoresis. In all these deposition methods, the powders described in the present invention show a number of distinct advantages over the phosphor powders produced by other methods. For example, small, spherical, narrow size distribution phosphor particles are more easily dispersed in liquid vehicles, they remain dispersed for a longer period and allow printing of smoother and finer features compared to powder made by alternative methods.

For many applications, phosphor powders are often dispersed within a paste which is then applied to a surface to obtain a phosphorescent layer. The powders of the present invention offer many advantages when dispersed in such a paste. For example, the powders will disperse better than non-spherical powders of wide size distribution and can therefore produce thinner and more uniform layers with a reduced lump count. Such a thick film paste will produce a brighter display due to the increased powder density in the phosphor layer. The number of processing steps can also be advantageously reduced.

One preferred class of intermediate products according to the present invention are thick film paste compositions, also referred to as thick film inks. These pastes are particularly useful for the application of the phosphor particles onto a substrate, such as for use in an electroluminescent display devices.

In the thick film process, a viscous paste that includes a functional particulate phase, such as phosphor powder, is screen printed onto a substrate. A porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a printing device and the thick film paste is deposited on top of the screen. The substrate to be printed is then positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and heating treatment to adhere the functional phase to the substrate. For increased line definition, the applied paste can be further treated, such as through a photolithographic process, to develop and remove unwanted material from the substrate.

Thick film pastes have a complex chemistry and generally include a functional phase, a binder phase and an organic vehicle phase. The functional phase can include the electroluminescent phosphor powders of the present invention which provide a luminescent layer on a substrate. The particle size, size distribution, surface chemistry and particle shape of the particles all influence the rheology of the paste.

The binder phase is typically a mixture of inorganic binders such as metal oxide or glass frit powders. For example, PbO based glasses are commonly used as binders. The function of the binder phase is to control the sintering of the film and assist the adhesion of the functional phase to the substrate and/or assist in the sintering of the functional phase. Reactive compounds can also be included in the paste to promote adherence of the functional phase to the substrate.

Thick film pastes also include an organic vehicle phase that is a mixture of solvents, polymers, resins or other organics whose primary function is to provide the appropriate rheology (flow properties) to the paste. The liquid solvent assists in mixing of the components into a homogenous paste and substantially evaporates upon application of the paste to the substrate. Usually the solvent is a volatile liquid such as methanol, ethanol, terpineol, butyl carbitol, butyl carbitol acetate, aliphatic alcohols, esters, acetone and the like. The other organic vehicle components can include thickeners (sometimes referred to as organic binders), stabilizing agents, surfactants, wetting agents and the like. Thickeners provide sufficient viscosity to the paste and also acts as a binding agent in the unfired state. Examples of thickeners include ethyl cellulose, polyvinyl acetate, resins such as acrylic resin, cellulose resin, polyester, polyamide and the like. The stabilizing agents reduce oxidation and degradation, stabilize the viscosity or buffer the pH of the paste. For example, triethanolamine is a common stabilizer. Wetting agents and surfactants are well known in the thick film paste art and can include triethanolamine and phosphate esters.

The different components of the thick film paste are mixed in the desired proportions in order to produce a substantially homogenous blend wherein the functional phase is well dispersed throughout the paste. The powder is often dispersed in the paste and then repeatedly passed through a roll-mill to mix the paste. The roll mill can advantageously break-up soft agglomerates of powders in the paste. Typically, the thick film paste will include from about 5 to about 95 weight percent, such as from about 60 to 80 weight percent, of the functional phase, including the phosphor powders of the present invention.

Phosphor paste compositions are disclosed in U.S. Pat. No. 4,724,161, U.S. Pat. No. 4,806,389, U.S. Pat. No. 4,902,567 which are incorporated herein by reference in their entirety. Generally, phosphors are deaggregated and are combined with organic additives to form the paste.

Some applications of thick film pastes require higher tolerances than can be achieved using standard thick-film technology, as is described above. As a result, some thick film pastes have photo-imaging capability to enable the formation of lines and traces with decreased width and pitch. In this type of process, a photoactive thick film paste is applied to a substrate substantially as is described above. The paste can include, for example, a liquid vehicle such as polyvinyl alcohol, that is not cross-linked. The paste is then dried and exposed to ultraviolet light through a photomask to polymerize the exposed portions of paste and the paste is developed to remove unwanted portions of the paste. This technology permits higher density lines and pixels to be formed. The combination of the foregoing technology with the phosphor powders of the present invention permits the fabrication of devices with resolution and tolerances as compared to conventional technologies using conventional phosphor powders.

In addition, a laser can be used instead of ultraviolet light through a mask. The laser can be scanned over the surface in a pattern thereby replacing the need for a mask. The laser light is of sufficiently low intensity that it does not heating the glass or polymer above its softening point. The unirradiated regions of the paste can be removed leaving a pattern.

Likewise, conventional paste technology utilizes heating of a substrate to remove the vehicle from a paste and to fuse particles together or modify them in some other way. A laser can be used to locally heat the paste layer and scanned over the paste layer thereby forming a pattern. The laser heating is confined to the paste layer and drives out the paste vehicle and heats the powder in the paste without appreciably heating the substrate. This allows heating of particles, delivered using pastes, without damaging a glass or even polymeric substrate.

Other deposition methods for the phosphor powders can also be used. For example, a slurry method can be used to deposit the powder. The powder is typically dispersed in an aqueous slurry including reagents such as potassium silicate and polyvinyl alcohol, which aids in the adhesion of the powder to the substrate. For example, the slurry can be poured onto the substrate and left to settle to the surface. After the phosphor powder has sedimented onto the substrate the supernatant liquid is decanted off and the phosphor powder layer is left to dry.

Phosphor particles can also be deposited electrophoretically or electrostatically. The particles are charged and are brought into contact with the substrate surface having localized portions of opposite charge. The layer is typically lacquered to adhere the particles to the substrate. Shadow masks can be used to produce the desired pattern on the substrate surface.

Ink-jet printing is another method for depositing the phosphor powders in a predetermined pattern. The phosphor powder is dispersed in a liquid medium and dispensed onto a substrate using an ink jet printing head that is computer controlled to produce a pattern. The phosphor powders of the present invention having a small size, narrow size distribution and spherical morphology can be printed into a pattern having a high density and high resolution. Other deposition methods utilizing a phosphor powder dispersed in a liquid medium include micro-pen or syringe deposition, wherein the powders are dispersed and applied to a substrate using a pen or syringe and are then allowed to dry.

Patterns of phosphors can also be formed by using an ink jet or micropen (small syringe) to dispense sticky material onto a surface in a pattern. Powder is then transferred to the sticky regions. This transfer can be done is several ways. A sheet covered with powder can be applied to the surface with the sticky pattern. The powder sticks to the sticky pattern and does not stick to the rest of the surface. A nozzle can be used to transfer powder directly to the sticky regions.

Many methods for directly depositing materials onto surfaces require heating of the particles once deposited to sinter them together and densify the layer. The densification can be assisted by including a molecular precursor to a material in the liquid containing the particles. The particle/molecular precursor mixture can be directly written onto the surface using ink jet, micropen, and other liquid dispensing methods. This can be followed by heating in a furnace or heating using a localized energy source such as a laser. The heating converts the molecular precursor into the functional material contained in the particles thereby filling in the space between the particles with functional material.

Thus, the phosphor powders produced according to the present invention result in smoother phosphor powder layers when deposited by such liquid or dry powder based deposition methods. Smoother phosphor powder layers are the result of the smaller average particle size, spherical particle morphology and narrower particle size distribution compared to phosphor powders produced by other methods. Smoother phosphor powder layers are valuable in various applications, especially those where the phosphor powders comprise an imaging device where a high resolution is critical. For example, a smoother phosphor powder layer in a display application where the phosphor layer produces light that is photographed results in improved definition and distinction of the photographed image.

A variety of deposition techniques often degrade the properties of the powders, especially brightness. An example is the three roll milling used to form pastes that are photoprinted, screen printed, directly written with a microsyringe and others. A method for increasing the brightness of the phosphor particles once deposited on the surface is to irradiate them with a laser (Argon ion, krypton ion, YAG, excimer, etc. . . . ). The laser light increases the temperature of the particles thereby annealing them and increasing the brightness. The laser heating of the particles can be carried out for particles on glass or even polymeric substrates since the laser causes local heating of the particles without heating the glass above its softening point. This approach is useful for phosphors.

The phosphor particle layer deposited onto a surface often needs to be coated to protect the layer from plasmas, moisture, electrons, photons, etc. Coatings can be formed by sputtering, but this requires a mask to avoid deposition onto undesired areas of the substrate. Laser-induced chemical vapor deposition (LCVD) of metal oxides and other materials onto particles can allow localized deposition of material to coat phosphor particles without coating other areas. The laser heating of the particles that drives the CVD can be carried out for particles on glass or even polymeric substrates because the laser causes local heating of the particles without heating the glass or polymer above its softening point.

Thus, the electroluminescent phosphor powders of the present invention have a unique combination of properties that are not found in conventional phosphor powders. The powders can advantageously be incorporated into a number of devices, wherein the devices will have significantly improved performance resulting directly from the characteristics of the phosphor powders of the present invention. The devices can include light-emitting lamps and display devices for visually conveying information and graphics.

Electroluminescent displays (EL displays) work by electroluminescence. EL displays are very thin structures which can have very small screen sizes, such as few inches diagonally, while producing a very high resolution image. These displays, due to the very small size, are utilized in many military applications where size is a strict requirement such as in aircraft cockpits, small hand-held displays and heads-up displays. These displays function by applying a high electric potential between two addressing electrodes. EL displays are most commonly driven by an A.C. electrical signal. The electrodes are in contact with a semiconducting phosphor thin-film and the large potential difference creates hot electrons which move through the phosphor, allowing for excitation followed by light emission.

Figure 37:
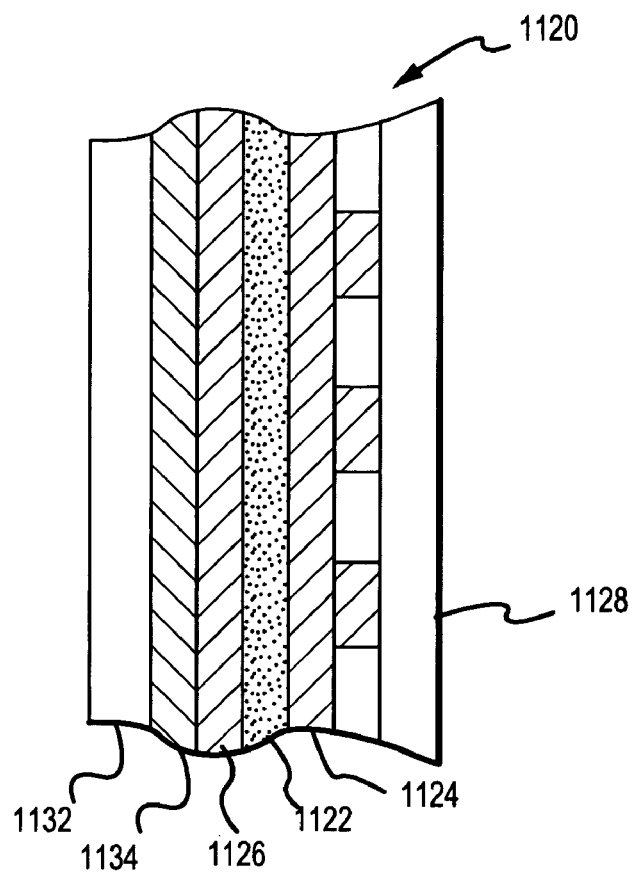
FIG. 37 schematically illustrates a cross-section of an electroluminescent display device according to an embodiment of the present invention.
Figure 38:
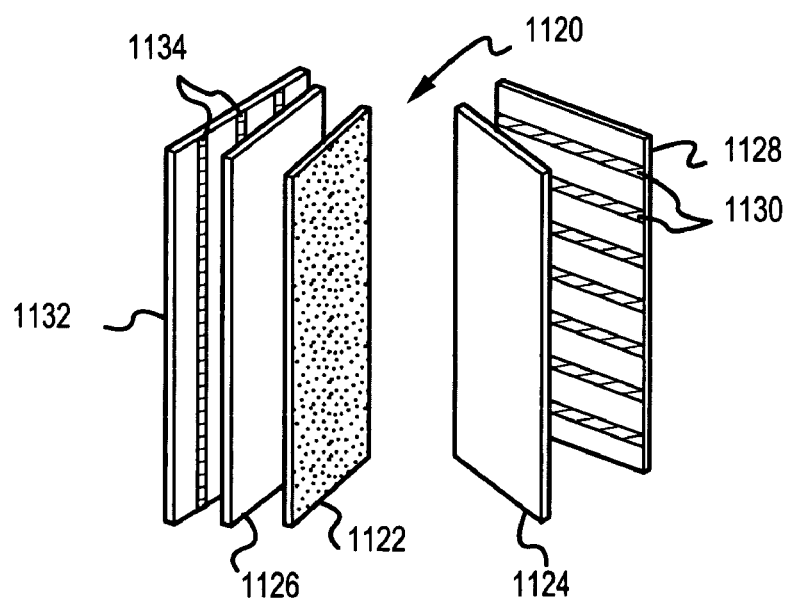
FIG. 38 schematically illustrates an exploded view of an electroluminescent display device according to an embodiment of the present invention.

An EL display is schematically illustrated in FIGS. 37 and 38. The EL display device 1120 includes a phosphor layer 1122 sandwiched between two dielectric insulating layers 1124 and 1126. On the back side of the insulating layers is a backplate 1128 which includes row electrodes 1130. On the front of the device is a glass faceplate 1132 which includes transparent column electrodes 1134, such as electrodes made from transparent indium tin oxide.

While current electroluminescent display configurations utilize a thin film phosphor layer 1122 and do not typically utilize phosphor powders, the use of very small monodispersed phosphor particles according to the present invention is advantageous for use in such devices. For example, small monodispersed particles could be deposited on a glass substrate using a thick film paste and sintered to produce a well connected film and therefore could replace the expensive and material-limited CVD technology currently used to deposit such films. Such a well-connected film could not be formed from large, agglomerated phosphor particles. Similarly, composite phosphor particles are a viable alternative to the relatively expensive multilayer stack currently employed in electroluminescent displays. Thus, a composite phosphor particle comprising the phosphor and a dielectric material could be used.

Particularly preferred phosphors for use in electroluminescent display applications include the metal sulfides such as ZnS:Cu, CaS:Ce, SrS:RE (RE=rare earth), and ZnS:Mn. Further, mixed metal sulfides such as $Sr_xCa_yBa_{1-x-y}S_N$:Ce can be used. Further, the thiogallate phosphors according to the present invention can also have advantages for use in electroluminescent displays. Oxide-based phosphors can also be useful, such as $SrGa_xO_y$:Eu, preferably including 5 to 7 atomic percent Eu, and $CaGa_xO_y$:Ce, preferably including from about 0.5 to 3 atomic percent Ce.

Figure 39:
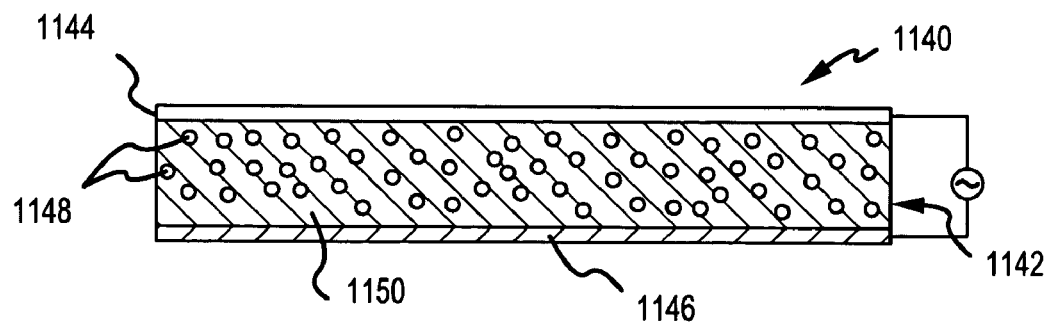
FIG. 39 illustrates an electroluminescent lamp according to an embodiment of the present invention.

Another use for phosphor powders according to the present invention is in the area of electroluminescent lamps. Electroluminescent lamps are formed on a rigid or flexible substrate, such as a polymer substrate, and are commonly used as back lights for membrane switches, cellular phones, watches, personal digital assistants and the like. A simple electroluminescent lamp is schematically illustrated in FIG. 39. The device 1140 includes a phosphor powder/polymer composite 1142 is sandwiched between two electrodes 1144 and 1146, the front electrode 1144 being transparent. The composite layer 1142 includes phosphor particles 1148 dispersed in a polymer matrix 1150.

Electroluminescent lamps can also be formed on rigid substrates, such as stainless steel, for use in highway signage and similar devices. The rigid device includes a phosphor particle layer, a ceramic dielectric layer and a transparent conducting electrode layer. Such devices are sometimes referred to as solid state ceramic electroluminescent lamps (SSCEL). To form such rigid devices, a phosphor powder is typically sprayed onto a rigid substrate.

Electroluminescent lamp manufacturers currently have only simple metal sulfides such as ZnS phosphor powder host material at their disposal. ZnS:Cu produces a blue color, while ZnS:Mn, Cu produces an orange color. These materials have poor reliability and brightness, especially when filtered to generate other colors. Additional colors, higher reliability and higher brightness powders are critical needs for the electroluminescent lamp industry to supply designers with the ability to penetrate new market segments. The phosphor layers should also be thinner and denser, without sacrificing brightness, to minimize water intrusion and eliminate light scattering. Higher brightness electroluminescent lamps require thinner phosphor layers, which requires smaller particle size phosphor powders that cannot produced by conventional methods. Such thinner layers will also use less phosphor powder. Presently available EL lamps utilize powders having an average size of about 5 μm or higher. The phosphor powders of the present invention having a small particle size and narrow size distribution, will enable the production of brighter and more reliable EL lamps that have an increased life-expectancy. Further, the phosphor powders of the present invention will enable the production of EL lamps wherein the phosphor layer has a significantly reduced thickness, without sacrificing brightness or other desirable properties. Conventional EL lamps have phosphor layers on the order of 100 μm thick. The powders of the present invention advantageously enable the production of an EL lamp having a phosphor layer that is not greater than about 15 μm thick, such as not greater than about 10 μm thick. The phosphor layer is preferably not thicker than about 3 times the weight average particle size, more preferably not greater than about 2 times the weight average particle size.

As discussed above, preferred electroluminescent sulfur-containing phosphors for use in electroluminescent lamps include ZnS:Cu for blue or blue-green and ZnS:Mn, Cu for orange. Other materials that are desirable for EL lamp applications include BaS:RE, Cu or Mn, CaS:RE or Mn, SrS:RE or Mn, and $Sr_xCa_yBa_{1-x-y}S$:RE (where RE is a rare earth element) for other colors. CaS:Ga or Cu and SrS:Ga or Cu are also useful. The thiogallate phosphors of the present invention, such as $SrGa_2S_4$ and $CaGa_2S_4$, can be particularly advantageous for use in electroluminescent lamps. As is discussed above, many of these phosphors cannot be produced using conventional techniques and therefore have not been utilized in EL lamp applications. When used in an EL lamp, these phosphors should be coated to prevent degradation of the phosphor due to hydrolysis or other adverse reactions. Preferably, such a coating has an average thickness of from about 2 to 50 nanometers.

Electroluminescent powders used in AC powder EL (ACEL) are generally required to have either on their surface or contained within them a moderately conductive phase. As an example, ZnS:Cu is well known to exist as a ZnS host with copper sulfide crystallites contained within each particle. The copper sulfide crystallites are the source of the electric field that excites the dopant in the ZnS lattice the causes light emission. In the case of other electroluminescent powders, such as the metal oxide-based doped metal gallates ($M_xGa_yO_z$), these powders should also contain either a conductive additional phase in each particle or a conductive coating on the particle surface. For example, according to this embodiment of the invention, $ZnGa_2O_4$ exhibits better performance when it is either coated or contains an additional conductive phase such as ZnO.

As stated above, electroluminescent lamps are becoming increasingly important for back lighting alphanumeric displays in small electronic devices such as cellular phones, pagers, personal digital assistants, wrist watches, calculators and the like. They are also useful in applications such as instrument panels, portable advertising displays, safety lighting, emergency lighting for rescue and safety devices, photographic backlighting, membrane switches and other similar applications. One of the problems associated with electroluminescent devices is that they generally require the application of alternating current (AC) voltage to produce light. A significant obstacle to the development of the useful direct current (DC) electroluminescent (DCEL) devices is a need for a phosphor powder that will function adequately under a DC electric field. The phosphor powder for functioning under a DC electric field should meet at least three requirements: 1) the particles should have a small average particle size; 2) the particles should have a uniform size, that is, the particles should have a narrow size distribution with no large particles or agglomerates; and 3) the particles should have good luminescence properties, particularly a high brightness. The phosphor powders of the present invention advantageously meet these requirements. Therefore, the phosphor powders of the present invention will advantageously permit the use of electroluminescent devices without requiring an inverter to convert a DC voltage to an AC voltage. Such devices are not believed to be commercially available at this time. When utilized in a device applying DC voltage, it is preferred to coat the phosphor particles with a thin layer of a conductive compound, such as a metal, for example copper metal, or a conductive compound such as copper sulfide.

EXAMPLES

A yttria powder batch was produced according to the present invention. An aqueous precursor solution was formed comprising yttrium nitrate and europium nitrate in a ratio to yield a phosphor comprising $Y_2O_3$ and 8.6 atomic percent Eu. The total precursor concentration was 7.5 weight percent based on the final product.

The liquid solution was atomized using ultrasonic transducers at a frequency of 1.6 MHz. Air was used as a carrier gas and the aerosol was carried through a tubular furnace having a temperature of 800° C. The total residence time in the furnace was about 1-2 seconds. The pyrolyzation at 800° C. resulted in intermediate precursor particles of a low crystallinity yttrium compound.

The intermediate precursor particles were then heated in batch mode at a temperature of 1400° C. for 60 minutes in air. The heating ramp rate was 10° C./minute.

Figure 40:
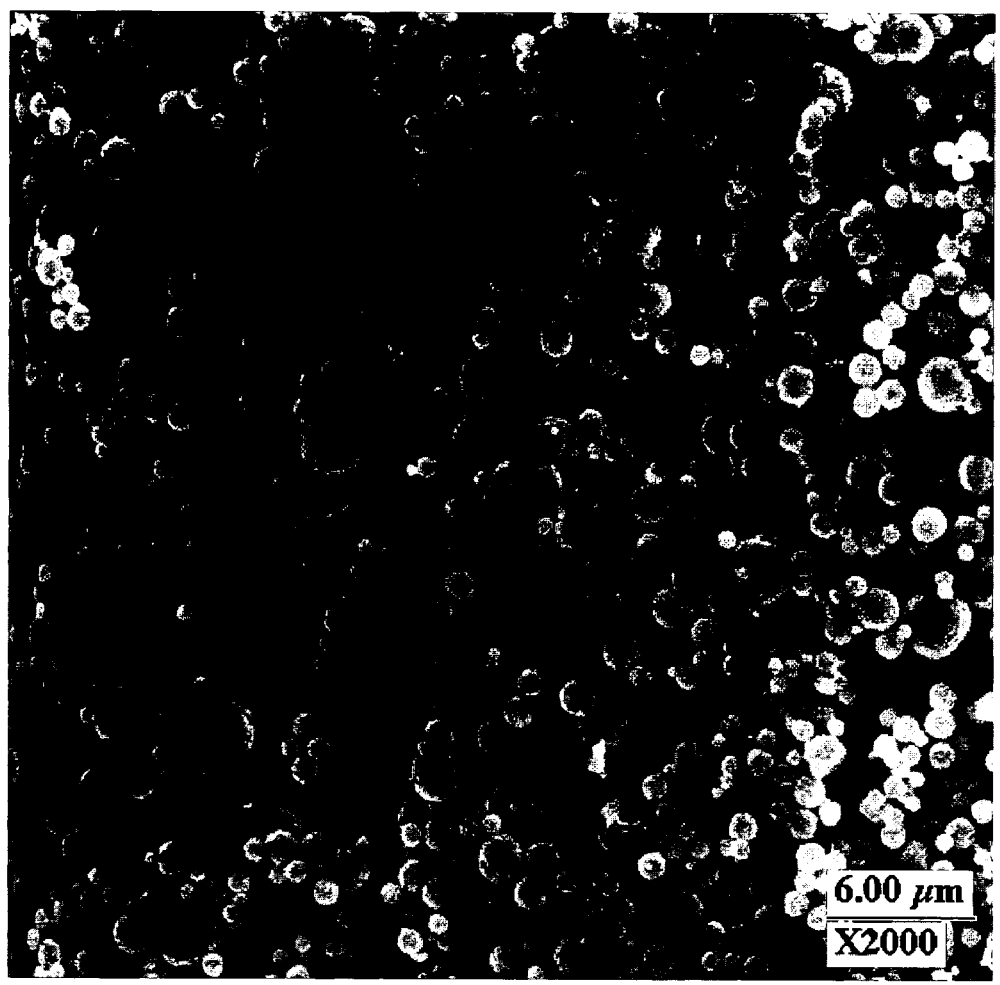
FIG. 40 illustrates an SEM photomicrograph of an electroluminescent phosphor powder according to an embodiment of the present invention.
Figure 41:
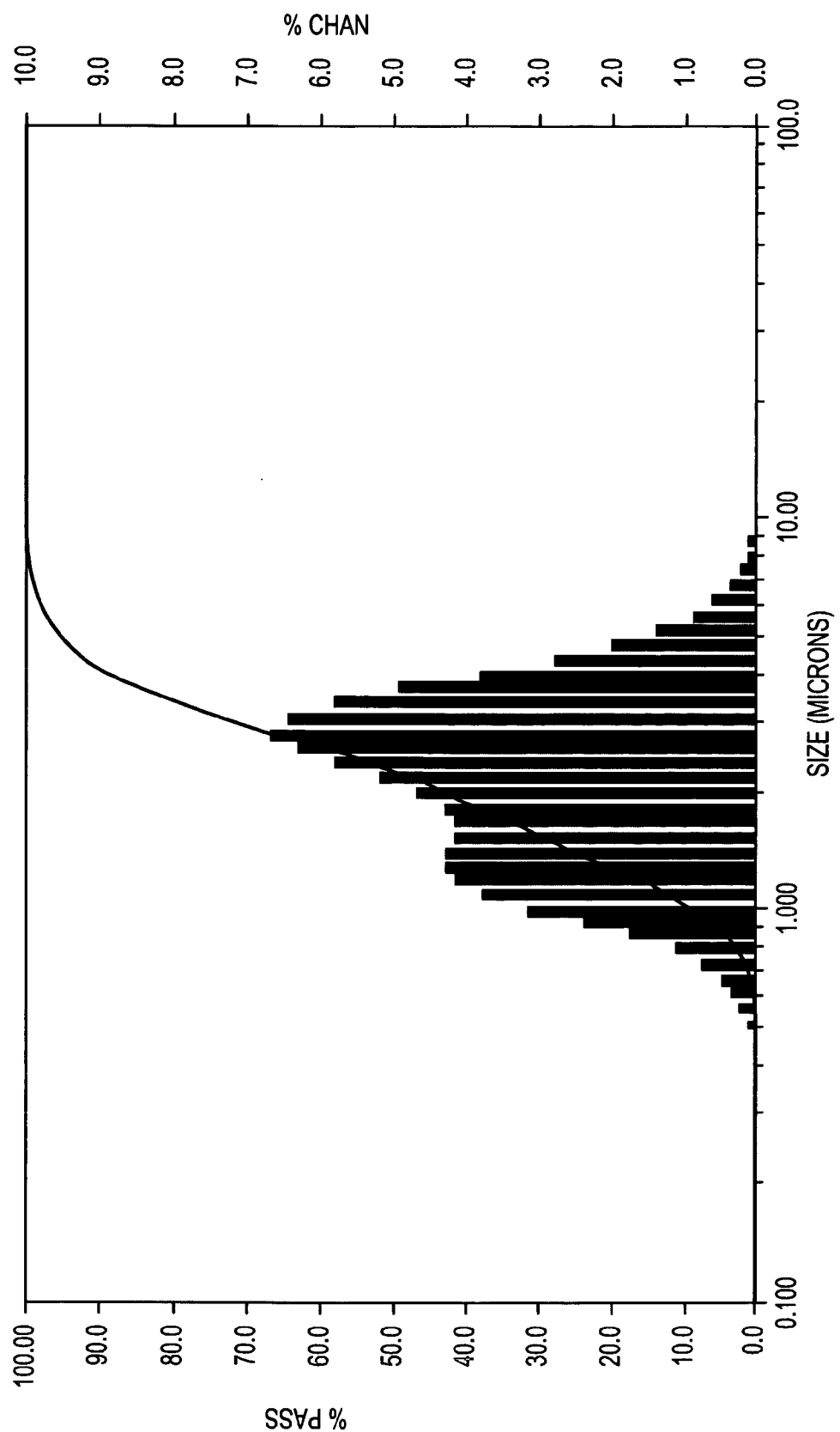
FIG. 41 illustrates the particle size distribution of an electroluminescent phosphor powder according to an embodiment of the present invention.
Figure 42:
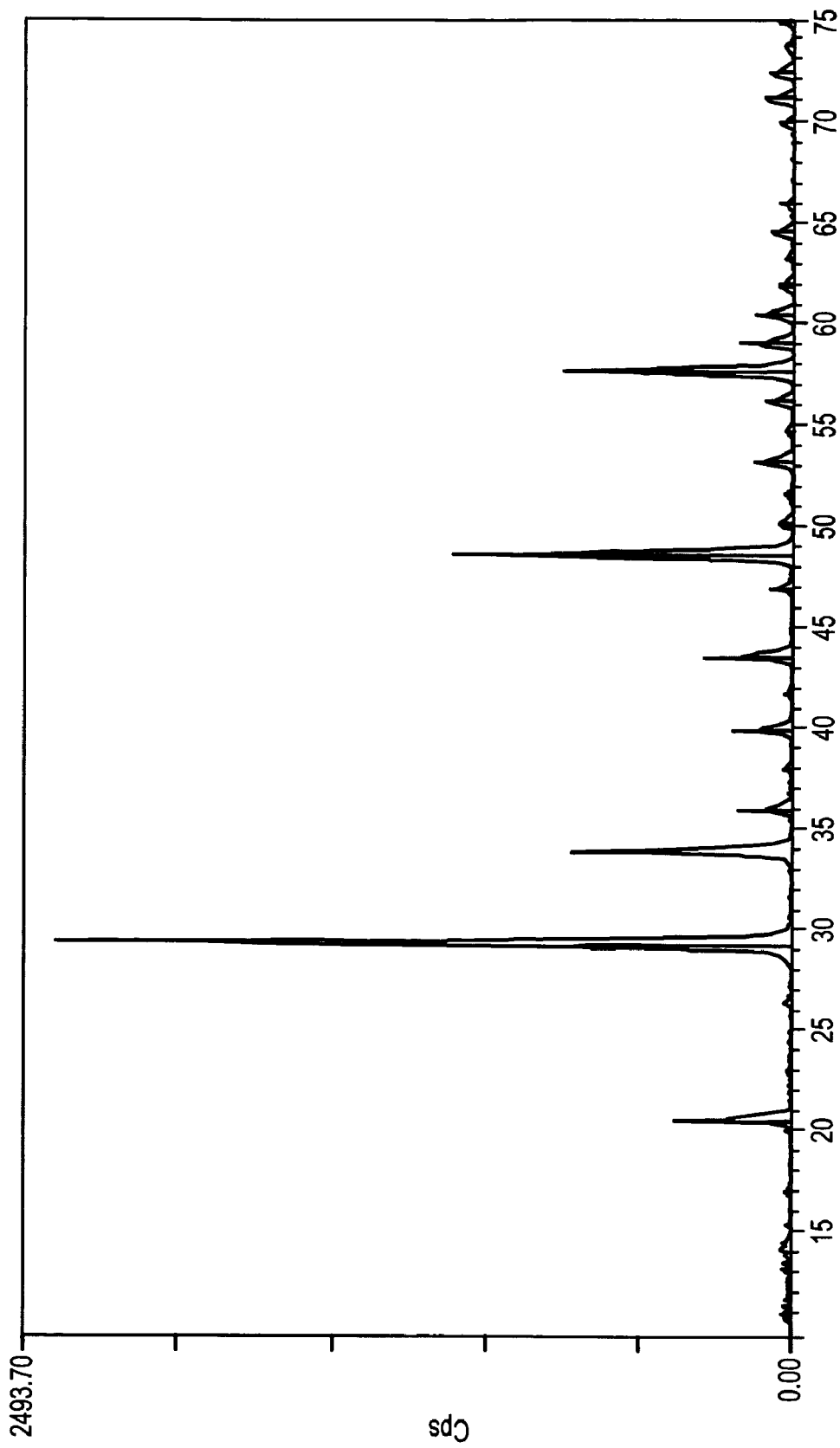
FIG. 42 illustrates an x-ray diffraction pattern of an electroluminescent phosphor powder according to an embodiment of the present invention.

The resulting powder is illustrated in the SEM photomicrograph of FIG. 40. The particle size distribution is illustrated in FIG. 41. The average particle size was 2.476 μm and 90 percent of the particles had a size of less than 4.150 μm. The x-ray diffraction pattern illustrated in FIG. 42 shows that the particles are substantially phase pure $Y_2O_3$.

In another example, an aqueous solution was formed including 2 mole equivalents gallium nitrate ($Ga(NO_3)_3$) and 1 mole equivalent strontium nitrate ($Sr(NO_3)_2$). About 0.05 mole equivalents of europium nitrate ($Eu(NO_3)_3$) was also added.

The aqueous solution was formed into an aerosol, substantially in accordance with Example 1. The aerosol was carried in air through a furnace heated to a temperature of about 800° C. to spray-convert the solution. The intermediate product was a $SrGa_2O_4$ oxide having a small average particle size and low impurities.

The oxide intermediate product was then roasted at 900° C. under a flowing gas that included $H_2S$ and nitrogen in a 1:1 ratio, for about 20 minutes. The resulting powder was substantially phase pure $SrGa_2S_4$:Eu (3 atomic percent Eu) having good crystallinity and good luminescent characteristics.

In a further example, $SrGa_2O_4$:Eu was prepared by mixing the appropriate ratios of strontium carbonate, gallium nitrate and europium nitrate. The total precursor concentration was 5 weight percent.

Figure 43:
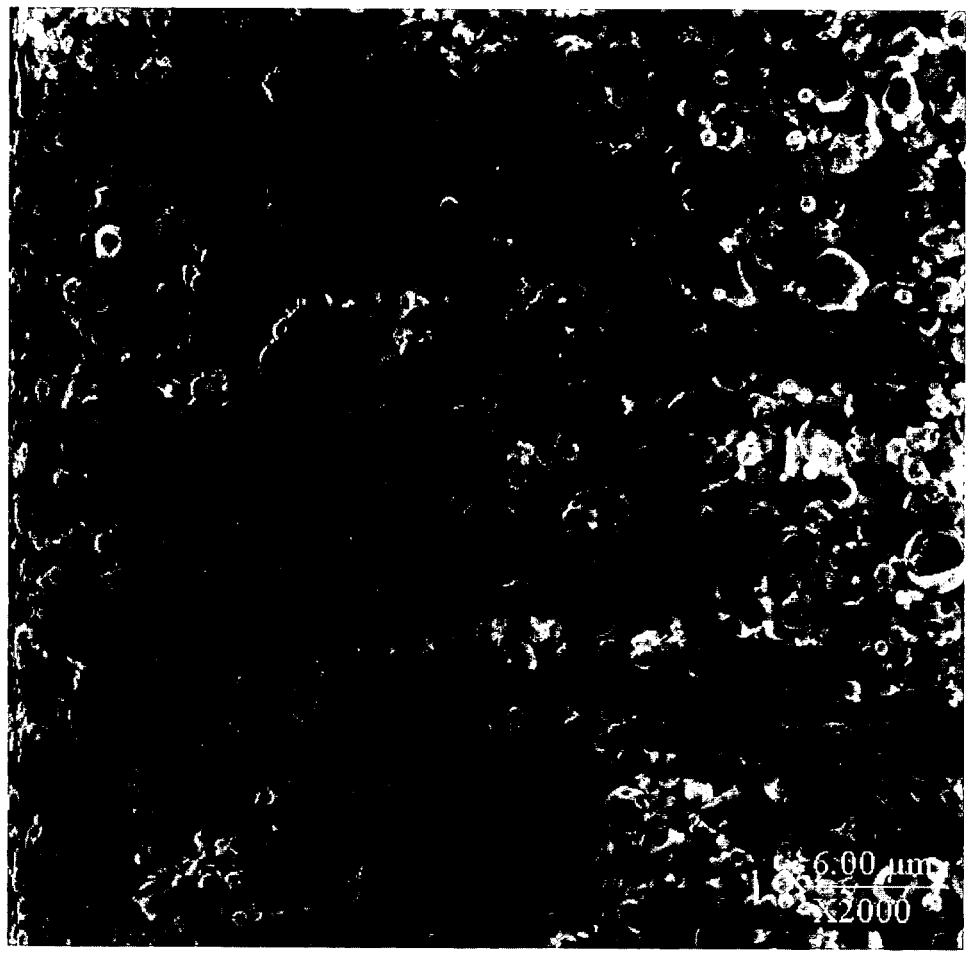
FIG. 43 illustrates an SEM photomicrograph of an electroluminescent phosphor powder according to an embodiment of the present invention.

The liquid solution was atomized using ultrasonic transducers at a frequency of 1.6 MHz. Air was used as the carrier gas and the aerosol was carried through a furnace heated to 800° C. This process formed an $SrGa_2O_4$:Eu phosphor having about 4 atomic percent Eu. This powder is illustrated in FIG. 43.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A phosphor powder batch comprising composite phosphor particles containing at least a first phase and at least a second phase dispersed within said first phase, wherein one of said phases is an electroluminescent phosphor and wherein said composite particle average size is between 0.1 and 10 microns.

2. The phosphor powder batch of claim 1 wherein the average particle size is from about 0.1 to 5 microns.

3. The phosphor powder batch of claim 1 wherein one of said phases is inorganic.

4. The phosphor powder batch of claim 1 wherein one of said phases is a metal oxide.

5. The phosphor powder batch of claim 1 wherein one of said phases is a metal sulfide.

6. The phosphor powder batch of claim 1 wherein the composite particles have substantially spherical morphology.

7. The phosphor powder batch of claim 1 wherein the crystallite size of one of said phases is at least 25 nm.

8. The phosphor powder batch of claim 1 wherein said first phase is uniformly distributed through said second phase and said second phase is a phosphor.

9. The phosphor powder batch of claim 1 wherein at least 80% of said composite particles are within twice the average size.

10. The phosphor powder batch of claim 1 wherein both phases are phosphor compounds.

11. An ink comprising the particles recited in claim 1.

12. An ink-jet ink comprising the particles recited in claim 1.

* * * * *